(12) United States Patent
Lenox

(10) Patent No.: US 8,904,717 B2
(45) Date of Patent: Dec. 9, 2014

(54) FIRE RESISTANT PV SHINGLE ASSEMBLY

(71) Applicant: SunPower Corporation, San Jose, CA (US)

(72) Inventor: Carl J. S. Lenox, Oakland, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 13/631,788

(22) Filed: Sep. 28, 2012

(65) Prior Publication Data

US 2013/0019922 A1   Jan. 24, 2013

Related U.S. Application Data

(63) Continuation of application No. 11/140,261, filed on May 27, 2005, now Pat. No. 8,276,329.

(51) Int. Cl.
*E04D 13/18* (2014.01)
*E04D 13/17* (2006.01)
*H01L 31/048* (2014.01)
*E04D 1/34* (2006.01)

(52) U.S. Cl.
CPC ............ *H01L 31/0482* (2013.01); *Y02E 10/50* (2013.01); *E04D 13/172* (2013.01); *Y02B 10/12* (2013.01); *E04D 2001/3447* (2013.01)
USPC ....................................................... 52/173.3

(58) Field of Classification Search
USPC ........... 52/173.3; 126/621, 622, 623; 136/251
See application file for complete search history.

(56) References Cited

U.S. PATENT DOCUMENTS

| | | | |
|---|---|---|---|
| 2,659,323 A | 11/1953 | Alvarez, Jr. |
| 3,769,091 A | 10/1973 | Leinkram et al. |
| 4,023,321 A | 5/1977 | Smith |
| 4,040,867 A | 8/1977 | Forestieri et al. |
| 4,111,188 A | 9/1978 | Murphy, Jr. |

(Continued)

FOREIGN PATENT DOCUMENTS

| | | |
|---|---|---|
| DE | 9109605 U1 | 9/1991 |
| DE | 20204963 U1 | 8/2002 |

(Continued)

OTHER PUBLICATIONS

Schott SunRoofTM FS Marketing Materials, 2 pages, in existence as of at least Jan. 2003.

(Continued)

*Primary Examiner* — Jessica Laux
(74) *Attorney, Agent, or Firm* — Knobbe, Martens, Olson & Bear LLP

(57) ABSTRACT

A fire resistant PV shingle assembly includes a PV assembly, including PV body, a fire shield and a connection member connecting the fire shield below the PV body, and a support and inter-engagement assembly. The support and inter-engagement assembly is mounted to the PV assembly and comprises a vertical support element, supporting the PV assembly above a support surface, an upper interlock element, positioned towards the upper PV edge, and a lower interlock element, positioned towards the lower PV edge. The upper interlock element of one PV shingle assembly is inter-engageable with the lower interlock element of an adjacent PV shingle assembly. In some embodiments the PV shingle assembly may comprise a ventilation path below the PV body. The PV body may be slidably mounted to the connection member to facilitate removal of the PV body.

24 Claims, 19 Drawing Sheets

(56) References Cited

U.S. PATENT DOCUMENTS

| | | | |
|---|---|---|---|
| 4,184,903 | A | 1/1980 | Lovelace et al. |
| 4,231,807 | A * | 11/1980 | Keeling et al. ............ 136/251 |
| 4,315,096 | A | 2/1982 | Tyan et al. |
| 4,321,416 | A | 3/1982 | Tennant |
| 4,421,943 | A | 12/1983 | Withjack |
| 4,428,361 | A | 1/1984 | Straza |
| 4,607,566 | A | 8/1986 | Bottomore et al. |
| 4,633,032 | A * | 12/1986 | Oido et al. ............ 136/251 |
| 4,677,248 | A | 6/1987 | Lacey |
| 4,769,086 | A | 9/1988 | Tanner et al. |
| 4,936,063 | A | 6/1990 | Humphrey |
| 5,056,288 | A | 10/1991 | Funaki |
| 5,316,592 | A | 5/1994 | Dinwoodie |
| 5,505,788 | A | 4/1996 | Dinwoodie |
| 5,571,338 | A | 11/1996 | Kadonome et al. |
| 5,573,600 | A | 11/1996 | Hoang |
| 5,746,839 | A | 5/1998 | Dinwoodie |
| 5,787,653 | A * | 8/1998 | Sakai et al. ............ 52/173.3 |
| 5,797,653 | A * | 8/1998 | Elzenbeck et al. ......... 297/300.5 |
| 5,990,414 | A | 11/1999 | Posnansky |
| 6,061,978 | A | 5/2000 | Dinwoodie et al. |
| 6,119,415 | A | 9/2000 | Rinklake et al. |
| 6,148,570 | A | 11/2000 | Dinwoodie et al. |
| 6,360,497 | B1 | 3/2002 | Nakazima |
| 6,463,708 | B1 | 10/2002 | Anderson |
| 6,521,821 | B2 | 2/2003 | Makita et al. |
| 6,584,737 | B1 | 7/2003 | Bradley, Jr. |
| 6,606,830 | B2 | 8/2003 | Nagao et al. |
| 6,786,012 | B2 | 9/2004 | Bradley, Jr. |
| 6,809,251 | B2 * | 10/2004 | Dinwoodie ............ 136/251 |
| 6,883,290 | B2 | 4/2005 | Dinwoodie |
| 6,959,520 | B2 | 11/2005 | Hartman |
| 7,155,870 | B2 | 1/2007 | Almy |
| 7,469,508 | B2 * | 12/2008 | Ceria ............ 52/173.3 |
| 7,592,537 | B1 | 9/2009 | West |
| 8,276,329 | B2 | 10/2012 | Lenox |
| 2001/0050101 | A1 | 12/2001 | Makita et al. |
| 2003/0154667 | A1 | 8/2003 | Dinwoodie |
| 2003/0154680 | A1 | 8/2003 | Dinwoodie |
| 2003/0213201 | A1 | 11/2003 | Szacsvay |
| 2003/0217768 | A1 | 11/2003 | Guha |
| 2004/0000334 | A1 | 1/2004 | Ressler |
| 2004/0031219 | A1 | 2/2004 | Banister |
| 2004/0098932 | A1 | 5/2004 | Broatch |
| 2005/0061311 | A1 | 3/2005 | Christensen |
| 2005/0217716 | A1 | 10/2005 | Masuda et al. |
| 2006/0042683 | A1 | 3/2006 | Gangemi |

FOREIGN PATENT DOCUMENTS

| | | |
|---|---|---|
| DE | 10240939 A1 | 3/2004 |
| JP | 5917168 | 1/1984 |
| JP | 5280168 | 10/1993 |
| JP | 2000064523 | 2/2000 |
| JP | 2000208803 | 7/2000 |

OTHER PUBLICATIONS

First Solar EZ Mount PV, Marketing Material, 3 pages, Internet page downloaded May 20, 2003.

ASE-300-DG/50 Photovoltaic Module, Marketing Material, 3 pages, 1995.

PowerLight Roof-Jack System, 1 sheet of drawings, 1996.

Supplementary European Search Report for corresponding European Application No. 05760430.8 published Oct. 25, 2007.

Notice of Allowance for U.S. Appl. No. 111049,260 mailed on Nov. 5, 2007.

* cited by examiner

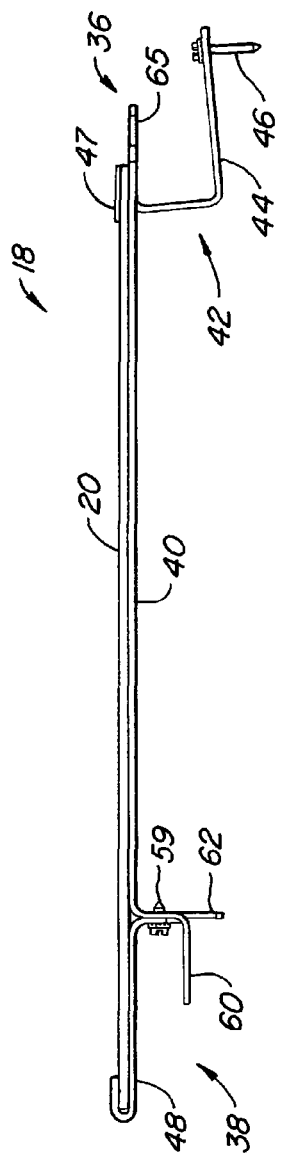
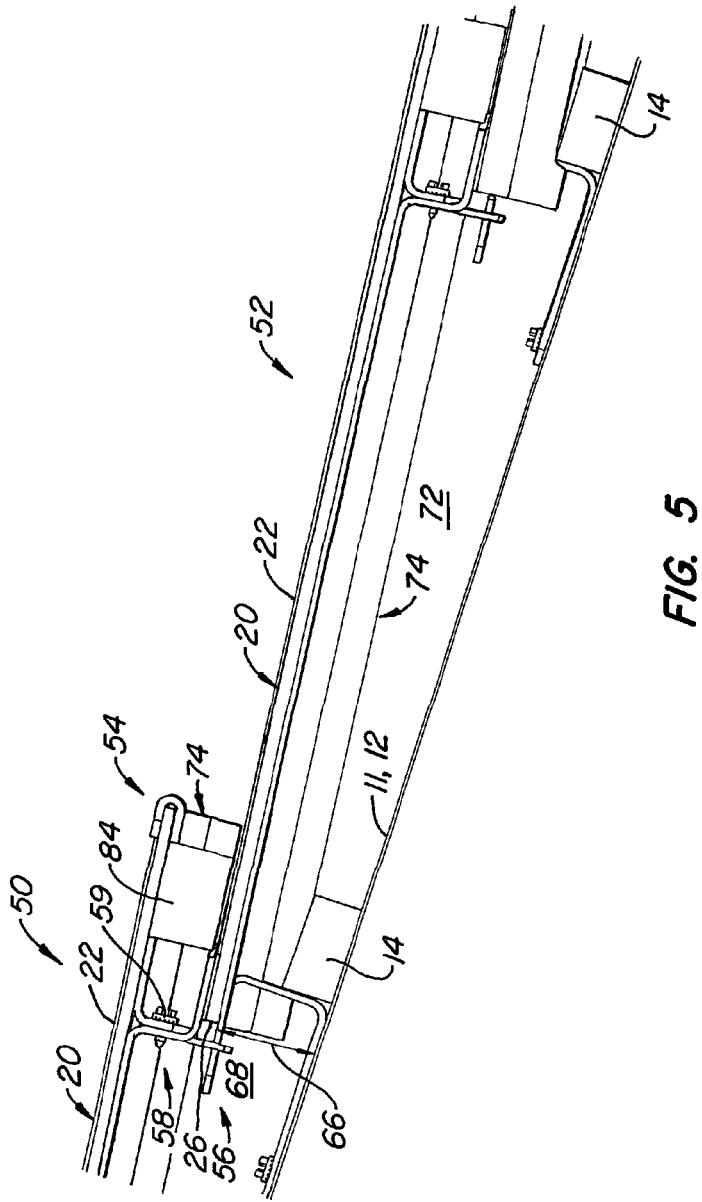
FIG. 4
FIG. 5

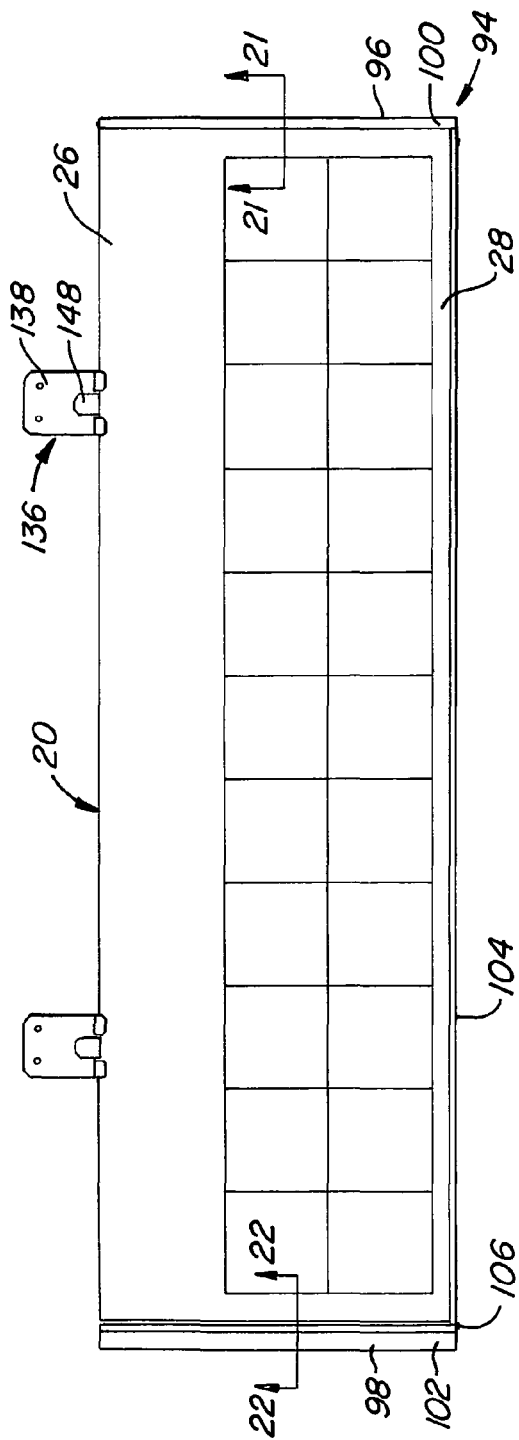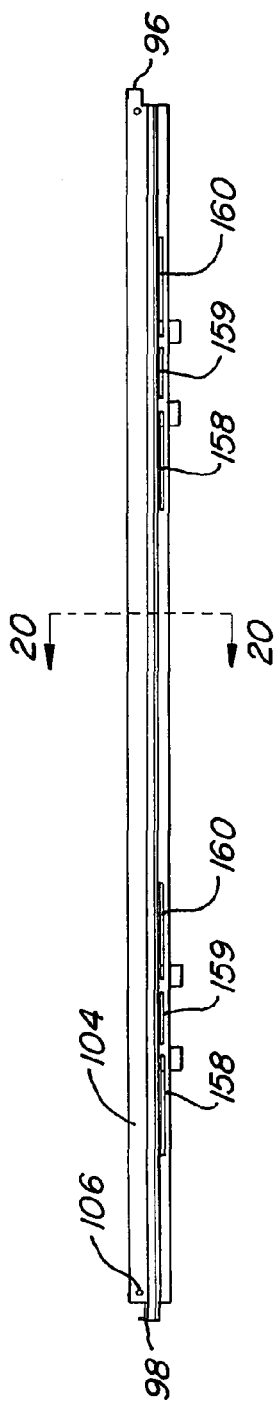
FIG. 18
FIG. 19

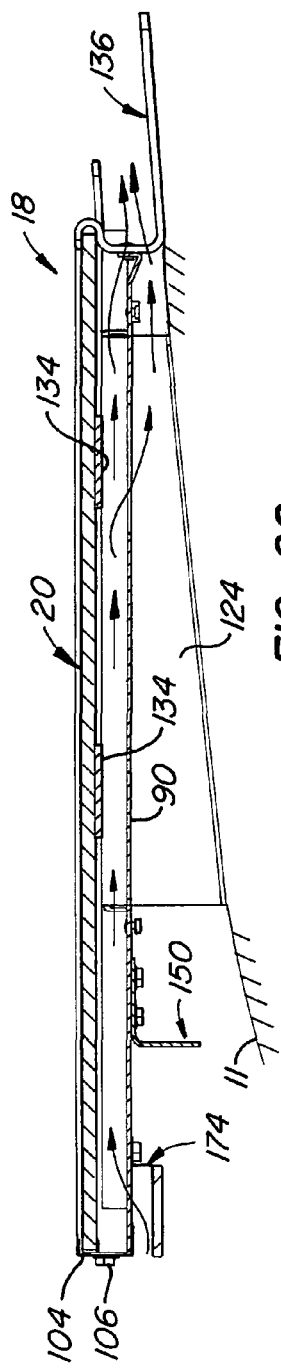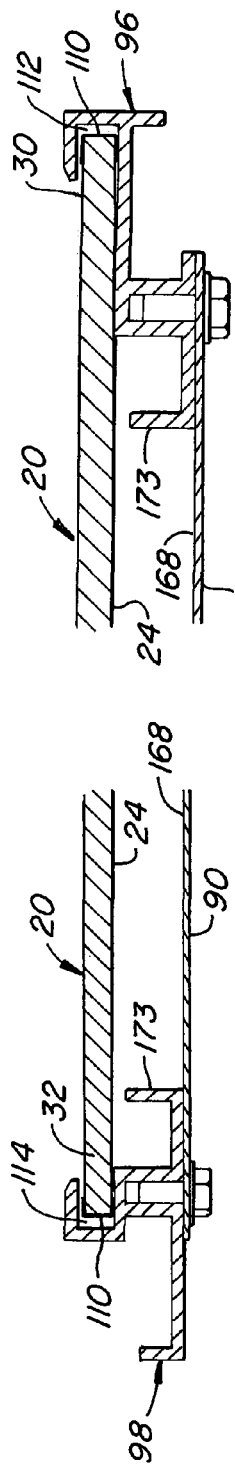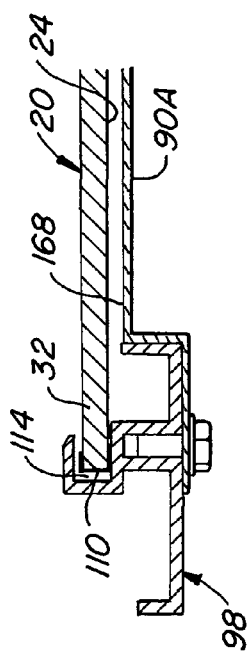

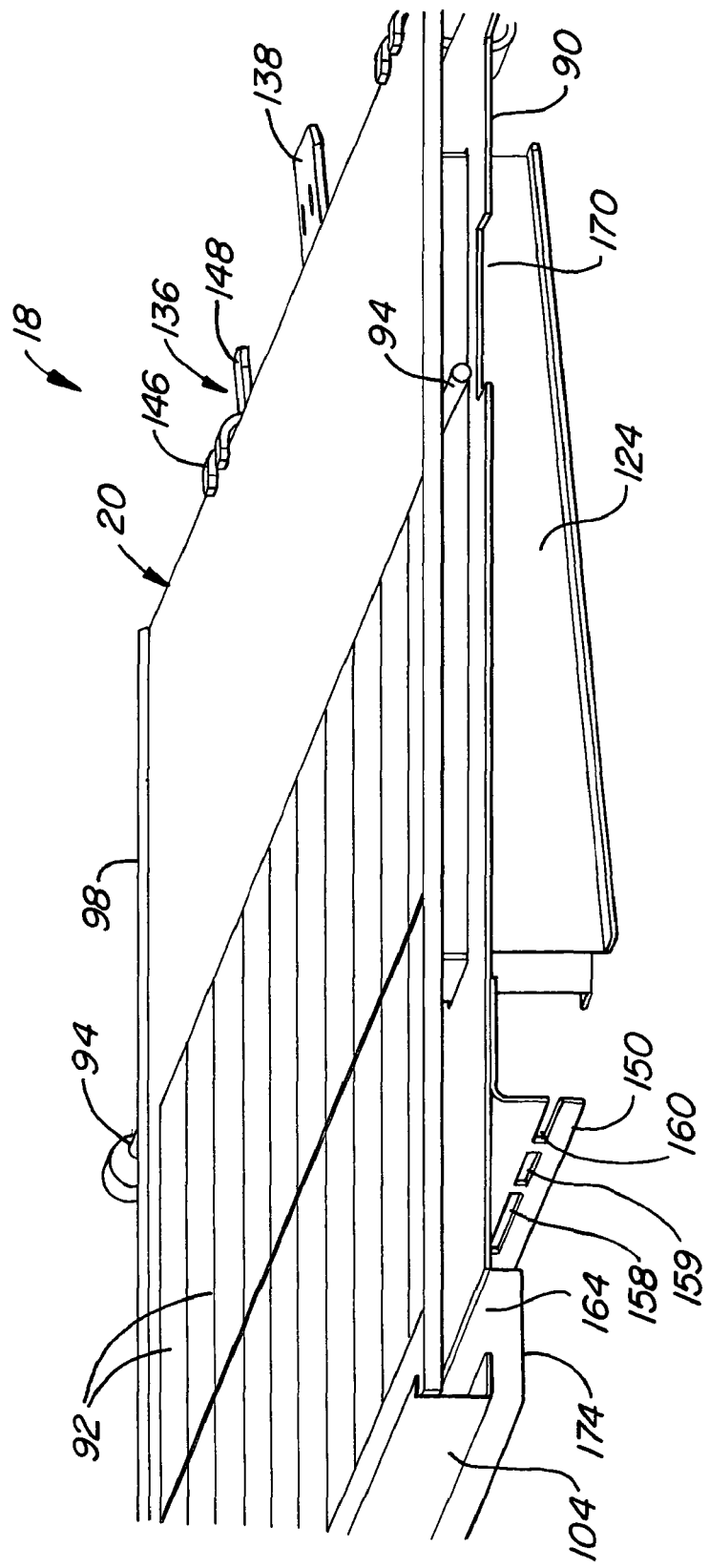

FIRE RESISTANT PV SHINGLE ASSEMBLY

CROSS-REFERENCE TO OTHER APPLICATIONS

This application is a continuation of U.S. application Ser. No. 11/140,261, filed May 27, 2005, which is related to U.S. patent application Ser. No. 10/872,126 filed 18 Jun. 2004.

STATE SPONSORED RESEARCH OR DEVELOPMENT

This invention was made with State of California support under California Energy Commission contract number 500-00-034. The Energy Commission has certain rights to this invention.

BACKGROUND OF THE INVENTION

The widespread use of photovoltaic (PV) systems mounted to homes, businesses and factories is generally considered to be a desirable goal. Several factors are believed to be critical to the acceptance of PV systems, in particular by the individual homeowner. Primary among the factors are ease of installation, cost and aesthetics. One way of addressing both cost and aesthetics has been through the use of photovoltaic shingle assemblies. One way such shingle assemblies address the cost issue is by being used as a replacement for conventional shingles, preferably using similar mounting techniques. The aesthetic issue has begun to be addressed by the use of photovoltaic assemblies in the form of shingles or roofing tiles having similar configurations and dimensions as conventional shingles or roofing tiles, and by the use of appropriate colors and reflecting characteristics to help provide an aesthetically pleasing visual appearance to the roof or other building surface. See, for example, U.S. Pat. No. 5,112,408. However, photovoltaic shingle systems have not been as widely accepted as hoped-for because 1) PV mounted integrally with the building roof as shingles operate at higher temperatures, causing a reduction in PV electrical output due to an inverse relationship between temperature and PV efficiency, as well as increasing the temperature of the roofing surface; 2) the same higher operating temperatures approach or exceed the upper limit of the warranted PV operating temperature and serve to shorten the useful life of the PV shingle; 3) some products call for electrical connections between shingles to be made under the roof deck, requiring holes to be drilled through the roof deck which increases the likelihood of water leaks; 4) there has been poor aesthetic match of PV shingles in conjunction with the non-PV areas of the roof; 5) some PV shingles have been limited to amorphous silicon PV technology, which suffer from a low operating efficiency; and 6) the value of the PV shingle has typically been limited to the electrical output of the PV plus the material value of displaced conventional shingles when the product displaces conventional shingles.

One of the concerns with using photovoltaic modules on a building roof is that in the photovoltaic module is a potential fire ignition source and also a potential source of fuel for a fire within the building. In recognition of this, some manufacturers install a Class A rated roof system, such as asphalt shingles, beneath Class C rated PV modules to meet building code requirements. Other manufacturers have used PV module constructions that have glass on both sides of the laminate (rather than Tedlar on the back side) to achieve this rating. However, this approach has not been used on PV modules that are intended to integrate with conventional concrete roofing shingles. Neither of these approaches prevents radiant heat transfer from the PV module to the roof.

See U.S. Pat. Nos. 3,769,091; 4,001,995; 4,040,867; 4,189,881; 4,321,416; 5,232,518; 5,575,861; 5,590,495; 5,968,287; 5,990,414; 6,061,978; 6,111,189; 6,584,737; and 6,606,830. See US Patent Application Publication Numbers US 2001/0050101; US 2003/0154680; US 2003/0213201; US 2003/0217768; and US 2004/0031219. See also EP1035591A1; and WO96/24013.

BRIEF SUMMARY OF THE INVENTION

The present invention is directed to a fire resistant PV shingle assembly which can be economically mounted directly to a support surface, such as a sloped roof, in a simple manner to create an aesthetically pleasing structure that integrates well with, for example, conventional roofing tiles. The PV shingle assembly can be constructed to be a substitute for a conventional shingle to eliminate the need for mounting the PV shingle assembly on top of a shingled, or other water-shedding, roof surface. The PV shingle assembly may also be constructed to achieve a Class A fire rating at least partially through the use of a fire shield below the PV body. The PV shingle assembly may also be constructed to provide a ventilation path beneath the PV body to reduce the operating temperature of the PV body and thus potentially improving energy conversion rates.

A first aspect of the invention is directed to a fire resistant PV shingle assembly for mounting to a support surface. The shingle assembly includes a PV assembly and a support and inter-engagement assembly. The PV assembly comprises a PV body having an upper PV surface, a lower PV surface, an upper PV edge, a lower PV edge and side PV edges. The PV body also comprises a fire shield, comprising an upper fire shield surface and a lower fire shield surface, and a connection member securing the PV body and the fire shield to one another. The fire shield is located below the lower PV surface. A support structure mounts the PV assembly to and supports the PV assembly above a support service.

In some embodiments the PV shingle assembly may comprise a ventilation path extending from the lower PV edge, along the fire shield and past the upper PV edge. The support structure may comprise a support and inter-engagement assembly comprising a vertical support element, supporting the PV assembly above a support surface, an upper interlock element, positioned towards the upper PV edge, and a lower interlock element, positioned towards the lower PV edge. The upper interlock element of one PV shingle assembly may be inter-engageable with the lower interlock element of an adjacent PV shingle assembly. A ventilation path may extend along one or both of the upper and lower fire shield surfaces. The PV body may be slidably mounted to the connection member to facilitate removal of the PV body. The fire shield preferably comprises a sheet of material, such as steel, having fire shield edges, an upper fire shield surface and a lower fire shield surface, the sheet of material being a non-flammable material that can structurally support a burning block of wood measuring 30.5 cm×30.5 cm×5.7 cm and weighing 2500 g+/−50 g, the block of wood burning at a temperature of 537° C.-815° C. A chosen one of the upper and lower interlock elements may comprise a tab having a tab width, and the other of the upper and lower interlock elements may comprise a slot having a slot width, the slot width being oversized by a chosen distance relative to the tab width to permit lateral adjustment of one shingle assembly relative to an adjacent shingle assembly, the chosen distance being at least about 20% of the length of the lower PV edge.

A second aspect of the invention is directed to a fire resistant photovoltaic (PV) shingle assembly for mounting to a support surface comprising a PV assembly, a support structure and a ventilation path. The PV assembly comprises a PV body having an upper PV surface, a lower PV surface, an upper PV edge, a lower PV edge and side PV edges, the lower PV surface comprising a fireproof surface. The support structure mounts the PV assembly to and supports the PV assembly above a support surface. The ventilation path extends from the lower PV edge, along the lower PV surface and past the upper PV edge. According to some embodiments, the upper and lower PV surfaces may comprise fireproof glass layers. First and second of the PV assemblies may be secured to an inclined support surface by their support structures. The ventilation path for the second, lower PV shingle assembly may extend to a position below the first, upper PV shingle assembly. The first, upper PV shingle assembly may comprise a downwardly extending rain guard mounted to the first, upper PV assembly at the PV lower edge thereof, the rain guard effectively contacting the upper PV surface of the PV body of the second, lower PV shingle assembly.

A third aspect of the invention is directed to a fire resistant photovoltaic (PV) shingle assembly installation comprising first, upper and second, lower PV shingle assemblies secured to an inclined support surface with the upper PV edge of the second, lower PV shingle assembly underlying the first, upper PV shingle assembly. The ventilation path for the second, lower PV shingle assembly extends to a position below the first, upper PV shingle assembly.

In some embodiments the first, upper PV shingle assembly may comprise a downwardly extending rain guard mounted to the first, upper PV assembly at the PV lower edge thereof, the rain guard contacting the upper PV surface of the PV body of the second, lower PV shingle assembly.

A fourth aspect of the invention is directed to a photovoltaic (PV) shingle assembly, for mounting to a support surface, comprising a PV assembly and a support and inter-engagement assembly. The PV assembly comprises a PV body and a mounting frame to which the PV body is mounted. The support and inter-engagement assembly is mounted to the PV assembly and comprises the following: a vertical support element supporting the PV assembly above a support surface, an upper interlock element positioned towards the upper PV edge, and a lower interlock element positioned towards the lower PV edge. The upper interlock element of one PV shingle assembly is inter-engageable with the lower interlock element of an adjacent PV shingle assembly. A chosen one of the upper and lower interlock elements comprises a tab having a tab width, and the other of the upper and lower interlock elements comprises a slot having a slot width. The slot width is oversized by a chosen distance relative to the tab width to permit lateral adjustment of one shingle assembly relative to an adjacent shingle assembly. The chosen distance is at least about 20% of the length of the lower PV edge.

A fifth aspect of the present invention is directed to a photovoltaic (PV) shingle assembly, for mounting to a support surface, comprising a PV assembly and a support and inter-engagement assembly. The PV assembly comprises a PV body having an upper PV surface, a lower PV surface, an upper PV edge, a lower PV edge and side PV edges, the upper and lower PV surfaces defining PV body planes. The PV assembly also comprises a mounting frame to which the PV body is mounted, the mounting frame comprising edge elements, the edge elements comprising grooves for slidably receiving the side PV edges. The mounting frame also comprises a front piece removably connected to the edge elements so that at least one of the PV body planes intersect the front piece to retain the PV body between the edge elements when the front piece is secured to the edge elements. The PV body is removable from between the edge elements when the front piece is spaced apart from the PV body planes. A support structure mounts the PV assembly to and supports the PV assembly above a support surface. In some embodiments the support structure may comprise a support and inter-engagement assembly including a vertical support element supporting the PV assembly above the support surface, an upper interlock element positioned towards the upper PV edge, and a lower interlock element positioned towards the lower PV edge so that the upper interlock element of one PV shingle assembly may be inter-engageable with the lower interlock element of an adjacent PV shingle assembly.

Various features and advantages of the invention will appear from the following description in which the preferred embodiments have been set forth in detail in conjunction with the accompanying drawings.

BRIEF DESCRIPTION OF THE DRAWINGS

FIG. 4 is a right side view of the shingle assembly of FIG. 2;

FIG. 5 is a side view of one of the rows of shingle assemblies of the roofing system of FIG. 1;

FIG. 9 is a simplified cross sectional view taken along line 9-9 of FIG. 6 illustrating the pan flashing element of FIGS. 5-8 with the side edges of laterally adjacent shingle bodies positioned adjacent to the upper end of the separator of the pan flashing element;

FIGS. 15-27 disclose embodiments of PV shingle assemblies using a fire shield opposite the lower PV surface of a PV body;

FIG. 15 is a top isometric view of a further embodiment in which the active areas on the upper PV surface are shown by a series of rectangles;

FIG. 16 is a top plan view of first and second shingle assemblies in a shingled, overlapping configuration as part of a roofing system, electrical wires shown extending from the side edges of the first shingle assembly;

FIG. 17 is unexploded isometric view of the shingle assembly of FIG. 15 with the width of the components being foreshortened;

FIGS. 18 and 19 are top plan and front elevational views of the shingle assembly of FIG. 15;

FIG. 20 is a side cross-sectional view taken along line 20-20 of FIG. 19;

FIGS. 21 and a 22 are enlarged cross-sectional views taken along lines 21-21 and 22-22 of FIG. 18 illustrating the PV body and the fire shield connected to the first and second inter-engaging edge elements;

FIG. 23 is a partial right side, top, front cross-sectional view of the shingle assembly of FIG. 15 with the width being foreshortened;

FIG. 24 shows a shingle assembly of FIG. 15 after screws securing the front piece to the edge elements have been removed and illustrating sliding the PV body between the grooves of the edge elements;

FIG. 25 is a top plan view of the structure of FIG. 24 after removal of the front piece and the PV body;

FIG. 26 is an enlarged cross-sectional view taken along line 26-26 of FIG. 16 showing ventilation paths formed by the inter-engaging PV shingle assemblies;

FIG. 27 is an enlarged cross-sectional view similar to that of FIG. 22 of alternative embodiment in which there is a small or no gap between the fire shield and the lower PV surface so the ventilation path extends along the lower fire shield surface;

DETAILED DESCRIPTION OF THE INVENTION

Figure 1:
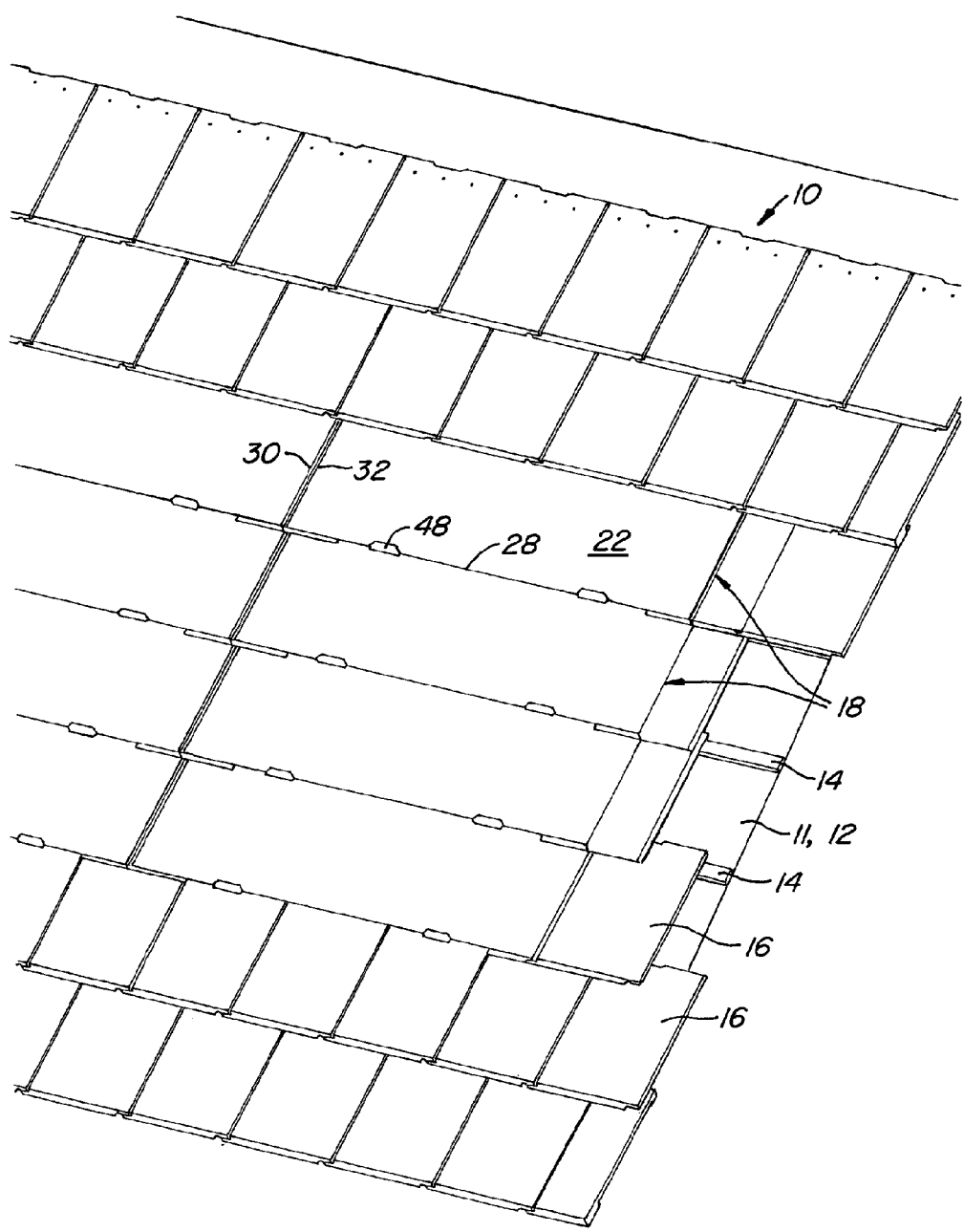
FIG. 1 is an overall view of a roofing system including an array of shingle assemblies made according to the invention.

FIG. 1 illustrates a roofing system 10 including a roofing support surface 11, support surface 11 comprising a waterproof and radiant barrier layer 12. Layer 12 may be a conventional underlayment, such as VersaShield® SB2S Fire Barrier Fabric from Elk Technologies, Inc. A series of laterally extending battens 14 are mounted to support surface 11 over layer 12. Support surface 12 is covered by conventional concrete tiles 16, such as MonierLifetile sold by MonierLifetile LLC of Irvine, Calif., and an array of photovoltaic (PV) shingle assemblies 18. As used in this application, a shingle covers products used to cover a wall or an inclined roof, or other non-horizontal surfaces, in which the lower end of one shingle overlaps the upper end of an adjacent shingle.

Figure 2:
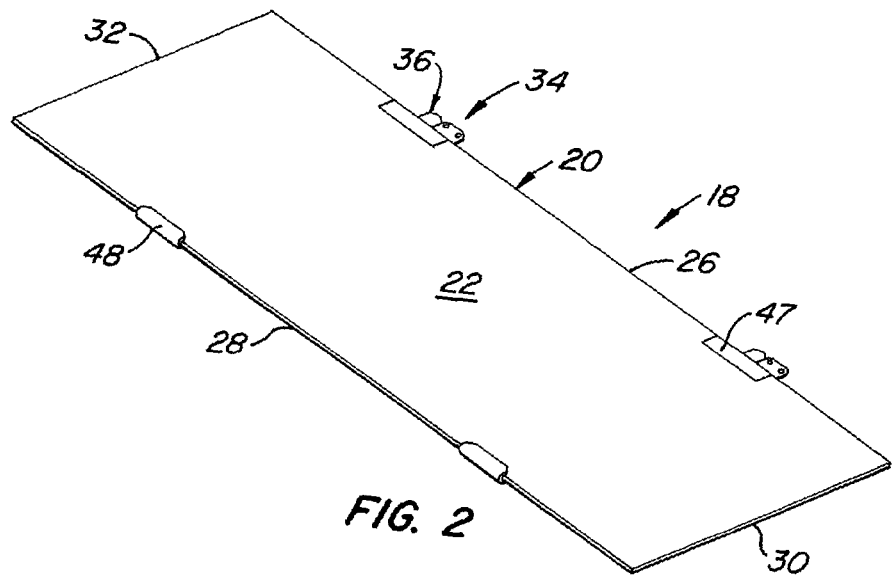
FIGS. 2 and 3 are top and bottom isometric views of a shingle assembly of FIG. 1.
Figure 3:
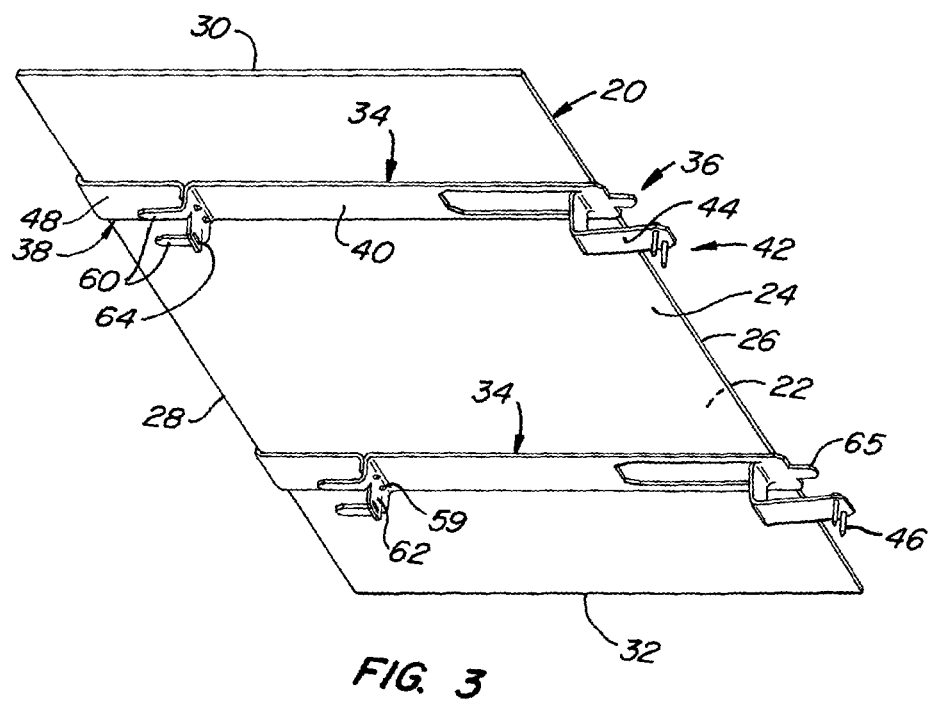

FIGS. 2 and 3 are enlarged top and bottom isometric views of a shingle assembly shown in FIG. 1. Each shingle assembly 18 comprises a shingle body 20 having upper and lower surfaces 22, 24, an upper edge 26, a lower edge 28, a first side edge 30 and a second side edge 32. Each shingle assembly 18 also includes a pair of support brackets 34 extending between upper and lower edges 26, 28. Support bracket 34 includes upper and lower ends 36, 38 connected by a middle portion 40. Upper end 36 comprises an upper support portion 42 extending downwardly away from lower surface 24. Portion 42 includes an upper support-surface-engaging part 44 used to secure support bracket 34, and shingle body 20 therewith, to support surface 11 using roofing nails, decking screws or other appropriate fasteners 46. Other fastening systems, such as the use of adhesives, may be used instead of or in addition to fasteners. Upper surface 22 of shingle body 20 has cushioning members 47 along upper edge 26 aligned with upper end 36. Lower end 38 comprises a clip 48 which engages lower edge 38 of shingle body 20. When appropriate, such as when clip 48 is made of steel, a protective material, such as a rubber pad, or soft polymer material such as butyl tape, may be placed between clip 48 and shingle body 20. The remainder of bracket 34 may be made of, for example, galvanized steel, a weatherable polymer or a polymer with a weatherable coating.

FIGS. 5-8 illustrate a first, upper shingle assembly 50 and a second, lower shingle assembly 52 mounted to support surface 11 with the lower end 54 of upper shingle assembly 50 overlying upper end 56 of lower shingle assembly 52. Lower end 38 of support bracket 34 includes a lower support portion 58 extending downwardly away from lower surface 24. Clip 48 is secured to portion 58 by a pair of self-tapping screws 59, or other suitable means. Portion 58 comprises a pair of support members 60 which rest on cushioning members 47 along the upper edge 26 of shingle assembly 52. Portion 50 also includes a downwardly extending tab 62 having an opening 64 formed therein. Opening 64 is sized and positioned for receipt of an engagement element 65 extending from upper end 36 of support bracket 34.

Upper end 36 of support bracket 34 positions upper edge 26 of shingle body 20 of lower shingle assembly 52 a first distance 66 above support surface 11 to create a first gap 68 therebetween. Lower edge 28 of shingle body 20 of upper shingle assembly 50 is spaced apart from upper surface 22 of shingle body 20 of lower shingle assembly 52 to create a second gap 70 therebetween. An open region 72 is created beneath upper shingle assembly 50 and fluidly couples first and second gaps 68, 70.

Figure 6:
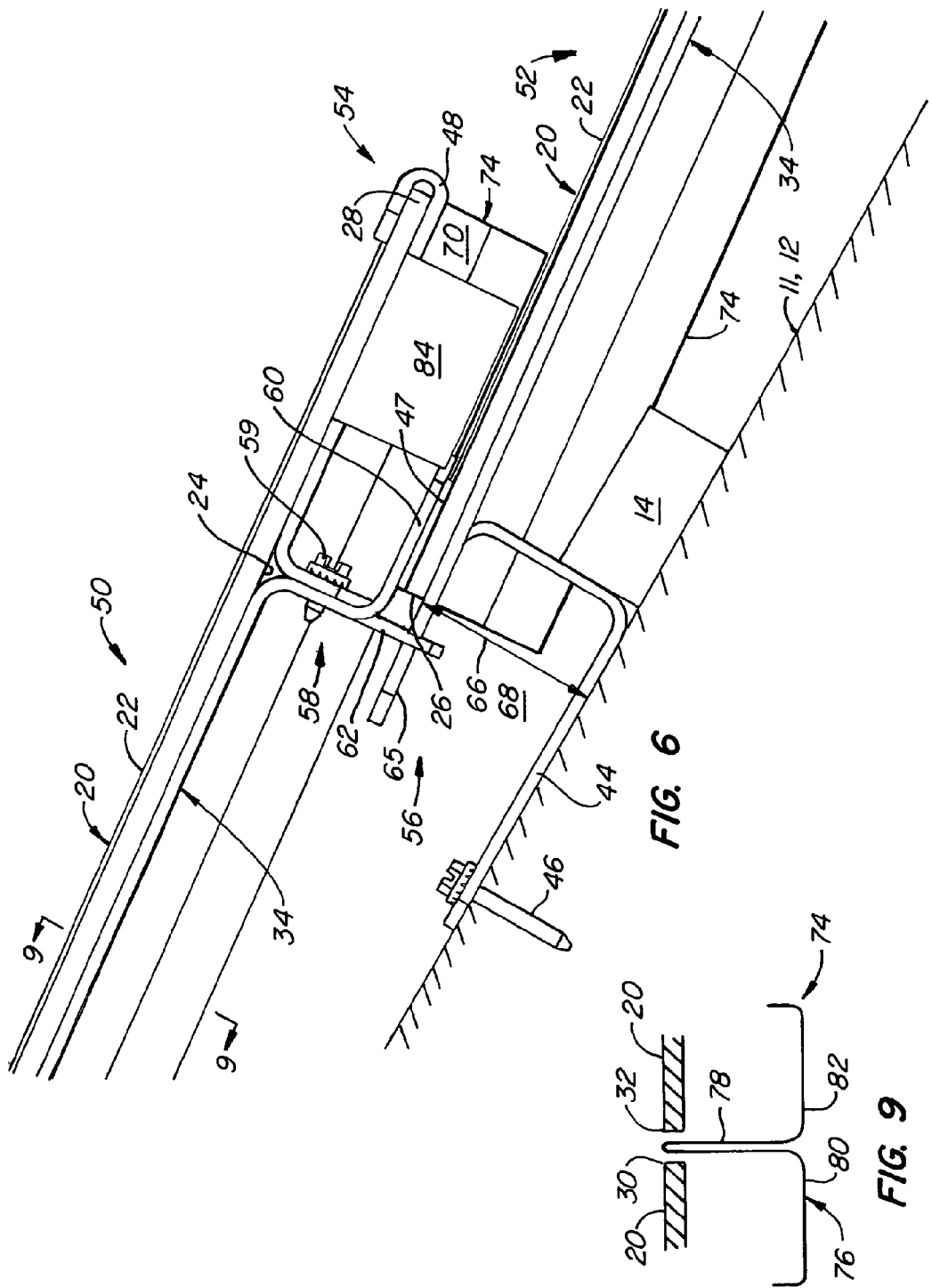
FIG. 6 is an enlarged view of a portion of the structure of FIG. 5.
Figure 7:
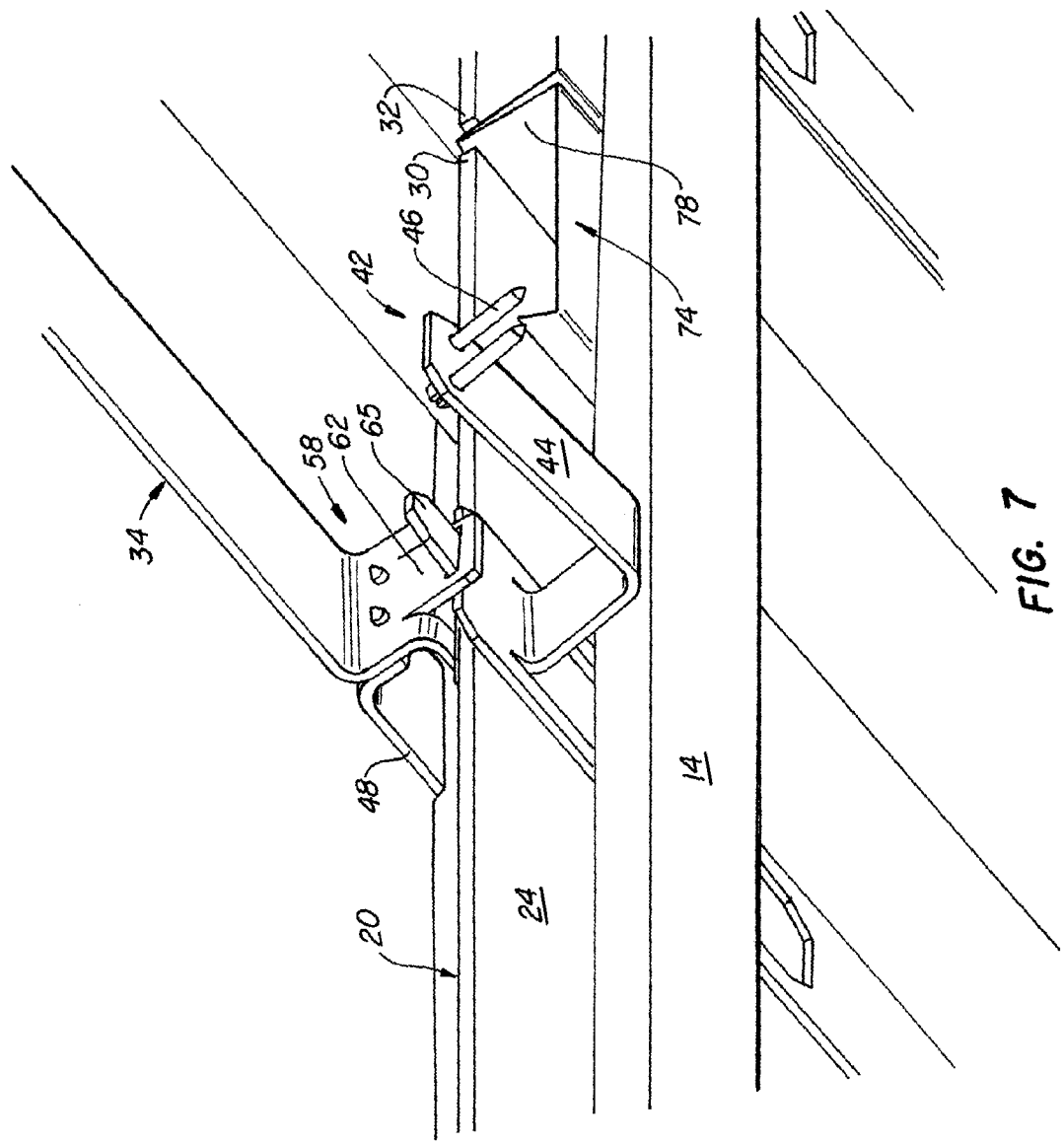
FIG. 7 is an underside view illustrating the interlocking of the upper and lower ends of the support brackets of upper and lower shingle assemblies with portions broken away for clarity.
Figure 8:
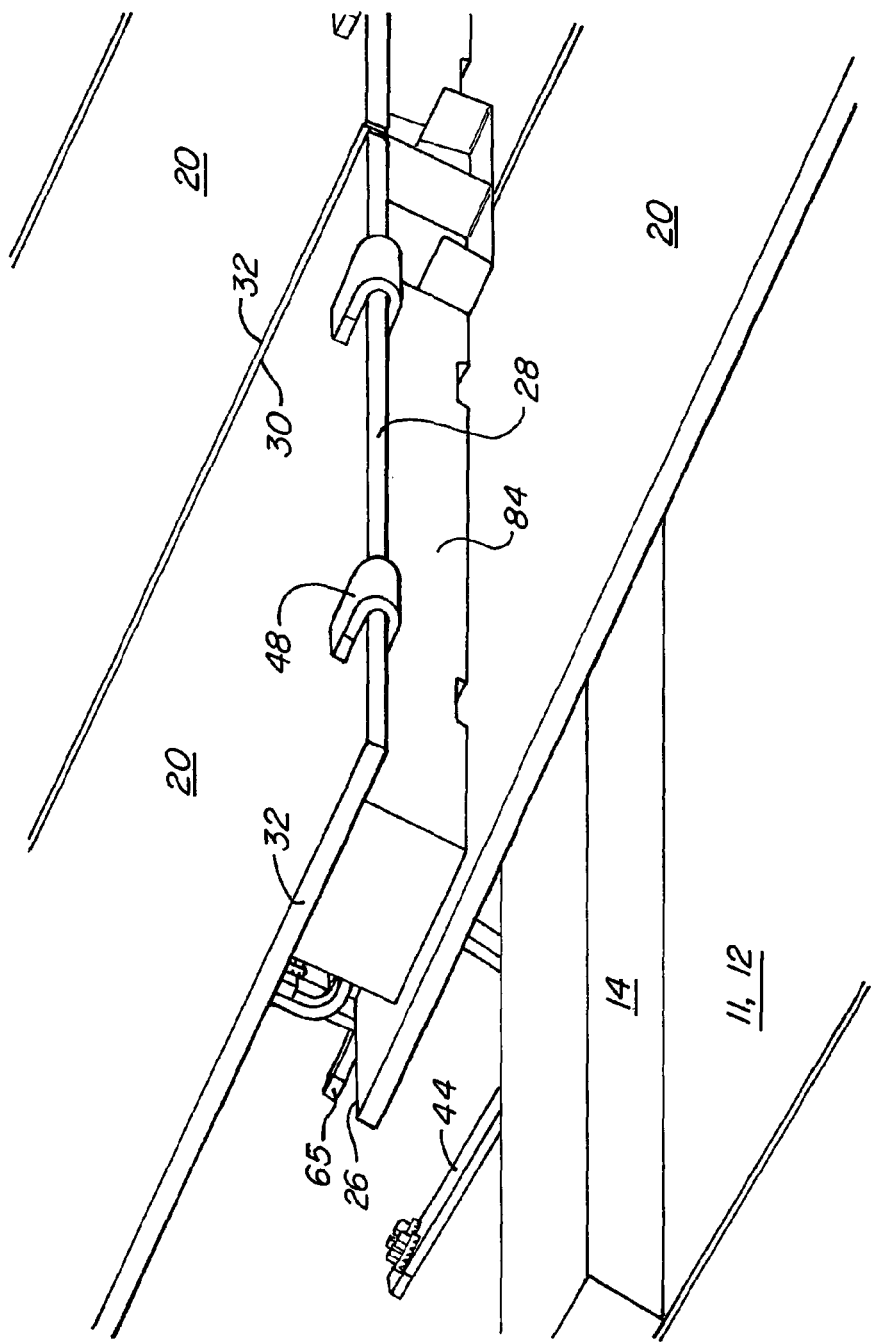
FIG. 8 is an overhead view illustrating the overlapping ends of upper and lower shingle assemblies.

A pan flashing element 74, see FIGS. 7-9, is used to collect rainwater that may pass between the side edges 30, 32 of laterally adjacent shingle assemblies 18. Element 74 includes a base 76 and a separator 78 extending upwardly from the base to a position between first and second side edges 30, 32. Base 76 defines first and second water-directing portions 80, 82 on either side of separator 78. The pan flashing element is secured in place by the weight of the tile above it and forces generated by fasteners holding the tile above it into place. The use of separator 78 helps to ensure that wind-blown material, in particular rain, is collected within water-directing portions 80, 82 of base 76. An air-permeable infiltration barrier 84, see FIGS. 5, 6 and 8, is positioned within second gap 70 to permit the movement of air into open region 72, thus helping to cool the underside of shingle body 20 and to prevent excessive moisture buildup, but prevents infiltration of wind-blown rain and insects, the building of bird nests, and other undesirable occurrences. A suitable infiltration barrier 84 is a perforated plastic block of material sold by Cor-A-Vent Inc. of Mishawaka, Ind. as Cor-A-Vent. A polycarbonate honeycomb, sold by Bellcomb Technologies of Minneapolis, Minn., may be preferred because it is durable and effectively fireproof.

Some type of adhesive may be used between support brackets 34 and lower surface 24 of shingle body 20 to hold the brackets in place during shipping and installation. A presently preferred adhesive is a butyl tape, which remains generally soft and sticky. Pan flashing element 74 may be made of any appropriate material, such as 24 gauge galvanized steel.

Figure 10:
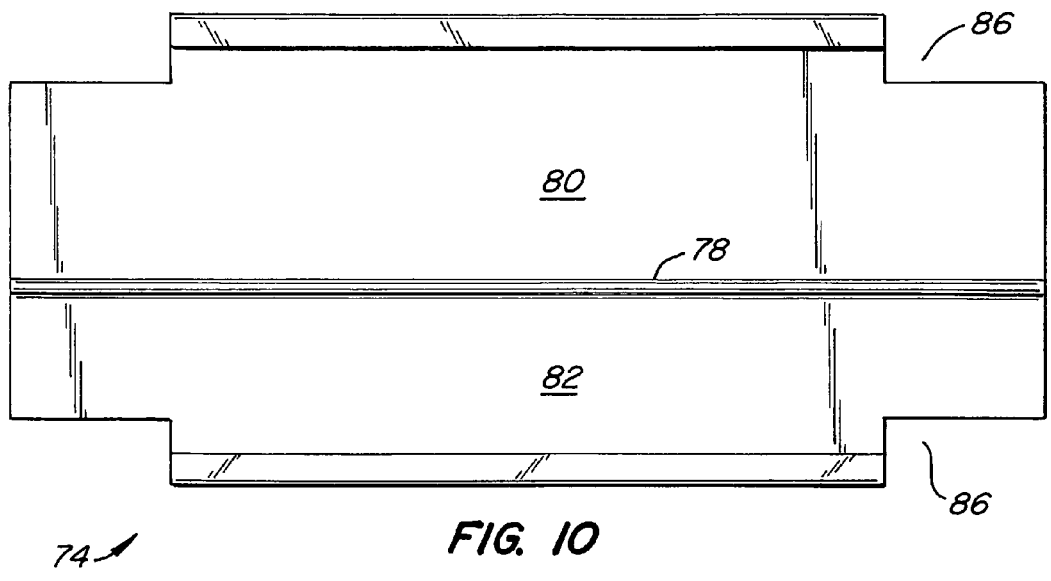
FIGS. 10, 11 and 12 are top, side and top perspective views of an alternative embodiment of the pan flashing element of FIGS. 5-9.
Figure 11:
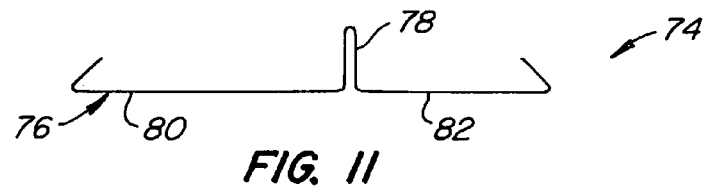
Figure 12:
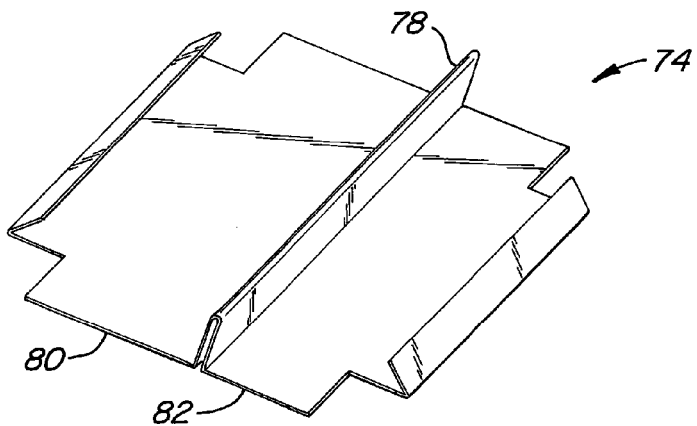

FIGS. 10-12 illustrate an alternative embodiment of the flash pan element 74 of FIGS. 5-9 specially designed for use with MonierLifetile brand of tiles 16 with like elements having like reference numerals. As can be seen from the Figs., there are cutouts 86 at the corners of this embodiment of flash pan element 74.

Figure 13:
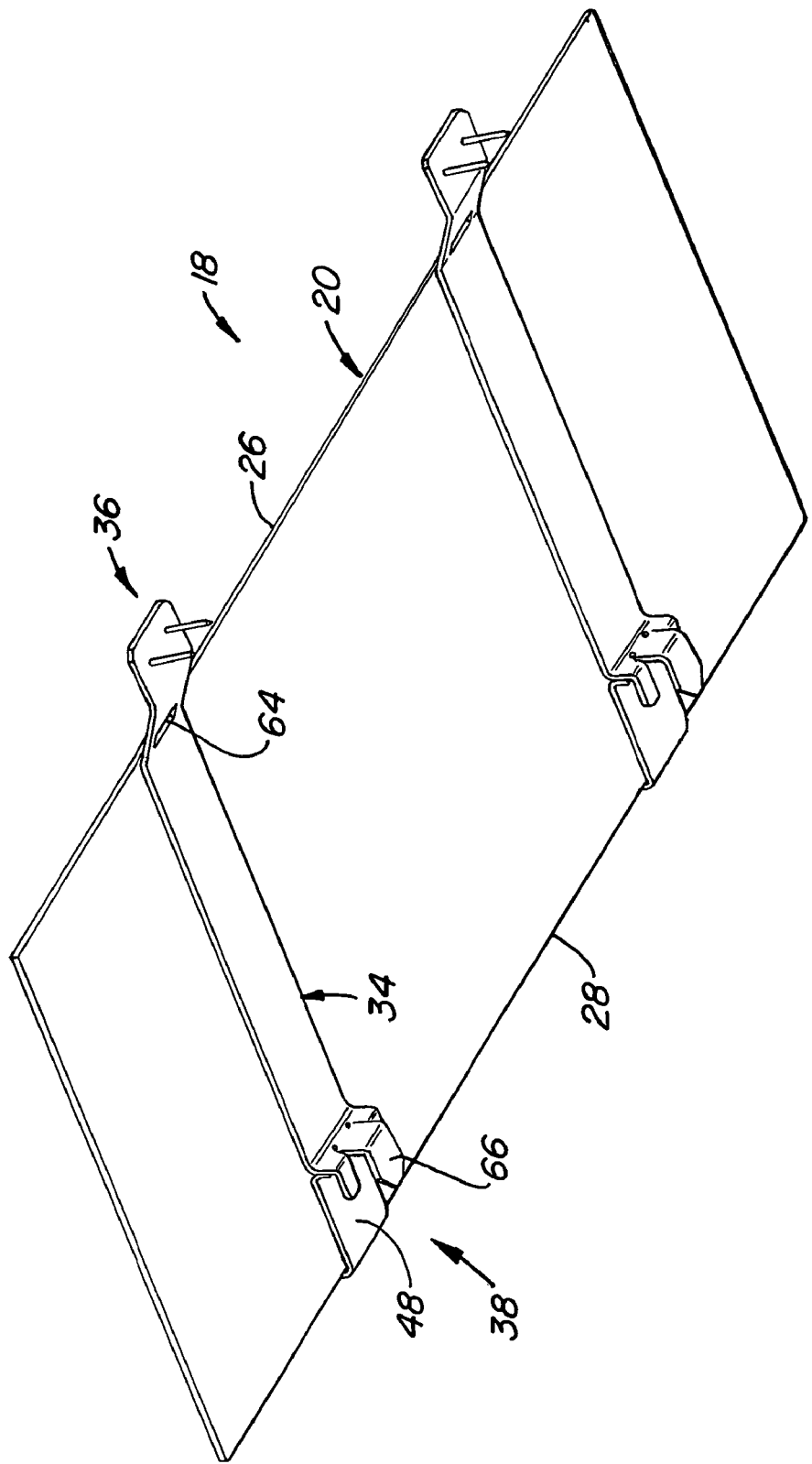
FIGS. 13 and 14 are views of an alternative embodiment of the shingle assembly of FIGS. 1-9 similar to the views of FIGS. 3 and 5.
Figure 14:
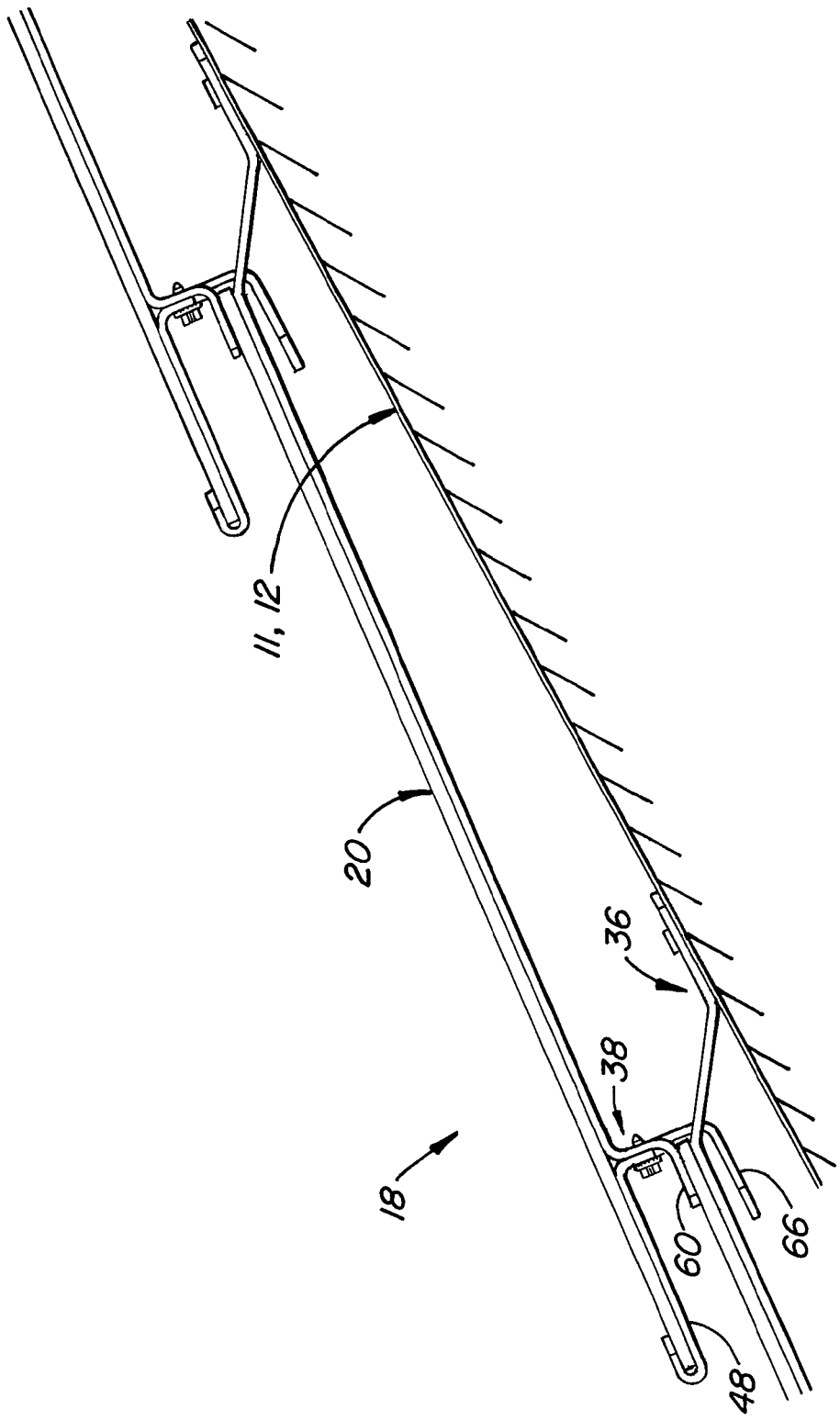

FIGS. 13 and 14 illustrate an alternative embodiment of the shingle assembly of FIGS. 2-4 with like reference numerals referring to like elements. The primary difference is that opening 64 is formed in upper end 36 of support bracket 34

(as opposed to lower end 38 in the prior embodiment) and engagement element 66 is a part of lower end 38 of support bracket 34.

Installation, when using concrete tiles 16, may proceed as with conventional concrete tile roof installation, with tiles 16 laid right to left in courses (rows) from the bottom towards the top of the roof (all directions facing the roof). Tiles 16 typically have a lip (not shown) that hooks onto batten 14. Concrete tiles 16 are generally staggered so that each row is offset from the one below it by one-half of a tile width. Where PV shingle assemblies 18 are to be installed, the tile 16 to the right of the bottom right tile may be cut off with a concrete saw. If the edge of a shingle assembly 18 falls in the middle of the tile below, the underhanging tongue of the adjacent full tile may be cut off. If not, a tile may be cut in half so that the cut edge roughly aligns between the two tiles below. A double pan flashing 74 is then placed beneath the adjacent concrete tile with separator 78 as close as practical to the side edge of the tile. The total width of the PV shingle assembly array is then measured off, including the gaps between PV shingle assemblies 18 with room for separator 78 of double pan flashing 74. Each PV shingle assembly 18 is preferably designed to span a whole number of concrete tiles, such as four. At the left side of the array of shingle assembly 16, either a half tile or whole tile (overhanging tongue not cut) is installed with a double pan flashing 74 with the separator 78 as close as possible to the edge of tile 16. The distance between the two pan flashings 74 is then verified to be the correct distance. Once this is accomplished, a first, bottom row of brackets 34 is installed with fasteners 46 passing into the support surface 11 at the correct spacing. The first row of brackets 34 has support members 60 located against the top edge of the concrete tiles 16. The first row of PV shingle assemblies 18 is then interengaged with the first row of brackets 34. Double pan flashing 74 is placed between each PV shingle assembly 18 in the row. Once the first, bottom row of PV shingle assemblies 18 is completed the rest of the concrete tiles 16 are installed conventionally. Then the next row of concrete tiles 16 is started. When the PV shingle assembly area is reached, the installation proceeds as above except that support members 60 of each bracket 34 interengages with the underlying upper end 36 of the bracket 34 and cushioning member 47 adhered to shingle body 20 at upper edge 26. In the course of this installation process, PV shingle assemblies 18 are wired together into strings and grounding jumpers are installed between all metal parts (pan flashings 74 and brackets 34). All home runs are run beneath PV shingle assemblies 18 and pass through support surface 11 through a sealed exit box, requiring a single penetration.

Other modification and variation can be made to the above-disclosed embodiments. For example, fewer or greater than two support brackets 34 may be used. Each support bracket may not include a middle portion. Also, a single support bracket may have more than one upper end 36 and/or lower end 38. Installation methods other than those described above may also be used.

Figure 15:
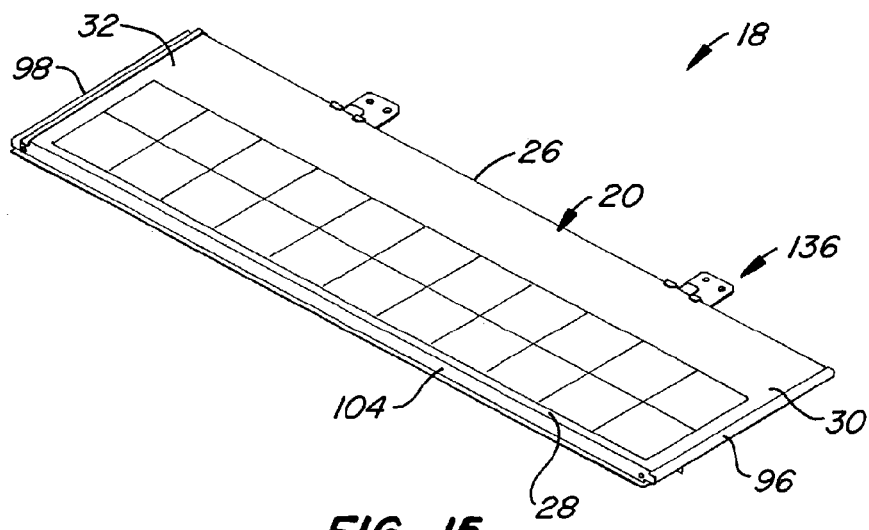
Figure 16:
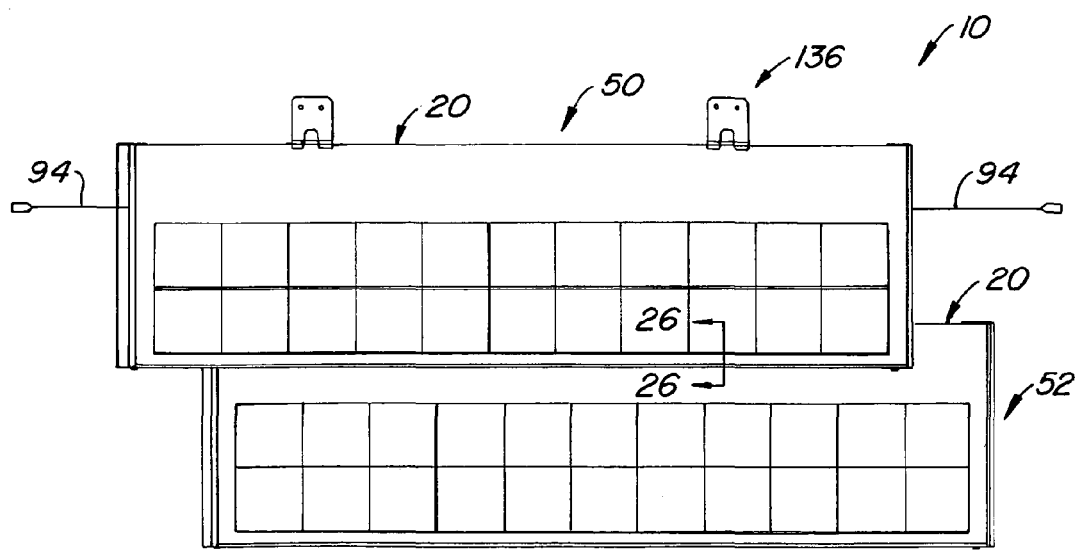
Figure 17:
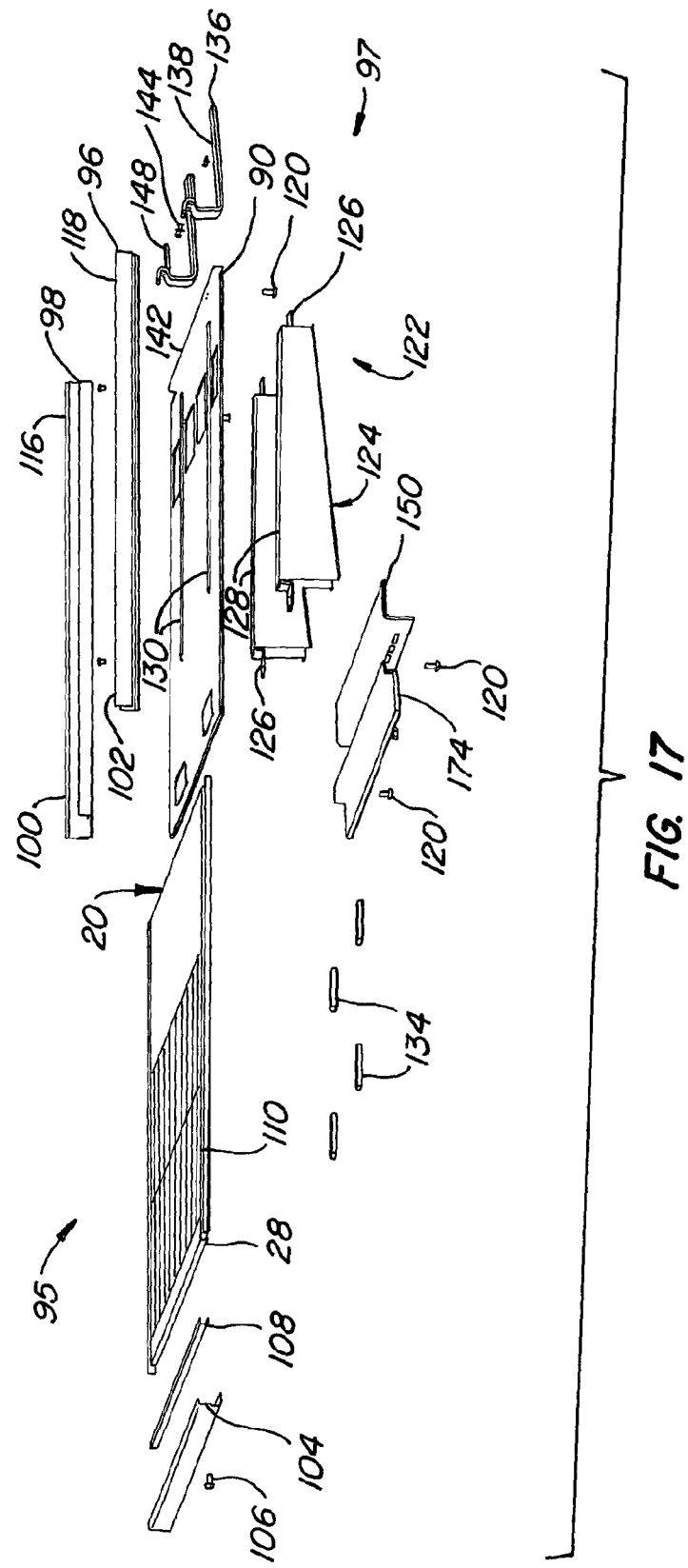

FIGS. 15-27 disclose further embodiments of the invention with like reference numerals referring to like elements. In each of these embodiments PV shingle assemblies 18 use a fire shield 90, see FIGS. 17 and 20, opposite lower PV surface 24 of PV body 20. FIG. 15 is a top isometric view of a PV shingle assembly 18 for which the active areas 92 on upper PV surface 22 are shown by two rows of rectangles. The open, non-active area above the active areas 92 accommodates the overlap of PV assemblies 18. FIG. 16 is a top plan view of first and second shingle assemblies 50, 52 in a shingled, overlapping configuration as part of a roofing system 10. Electrical wires 94, shown in FIG. 16, extend from side edges 30, 32 of first shingle assembly 50.

PV shingle assembly 18 comprises a PV assembly 95 and a support and inter-engagement assembly 97. Assembly 97 is used to support PV assembly 95 on a support surface 11. Assembly 97 is also used to inter-engage adjacent PV shingle assemblies 18 to one another. See FIG. 17. PV assembly 95 includes PV body 20, fire shield 90 and what is termed a connection member 94. Connection member 94, see FIGS. 17 and 18, includes first and second inter-engageable edge elements 96, 98 secured to one another at the lower ends 100, 102 of edge elements 96, 98 by a front piece 104. A pair of screws 106 passes through front piece 104 and secure front piece 104 to edge elements 96, 98. A strip of foam tape 108 is placed between front piece 104 and lower PV edge 28 to help protect PV body 20 from damage. Low friction slide tape 110 is mounted to first and second side edges 30, 32 of PV body 20. The slide tape-covered edges 30, 32 are located within grooves 112, 114, see FIGS. 21 and 22, formed within first and second edge elements 96, 98. Slide tape 110 promotes sliding engagement of first and second side edges 30, 32 of PV body 20 within grooves 112, 114 of edge elements 96, 98 as discussed below with reference to FIG. 24. Fire shield 90 is secured to lower ends 100, 102 and upper ends 116, 118 of edge elements 96, 98 by screws 120 passing through fire shield 90 and into edge elements 96, 98.

Figure 24:
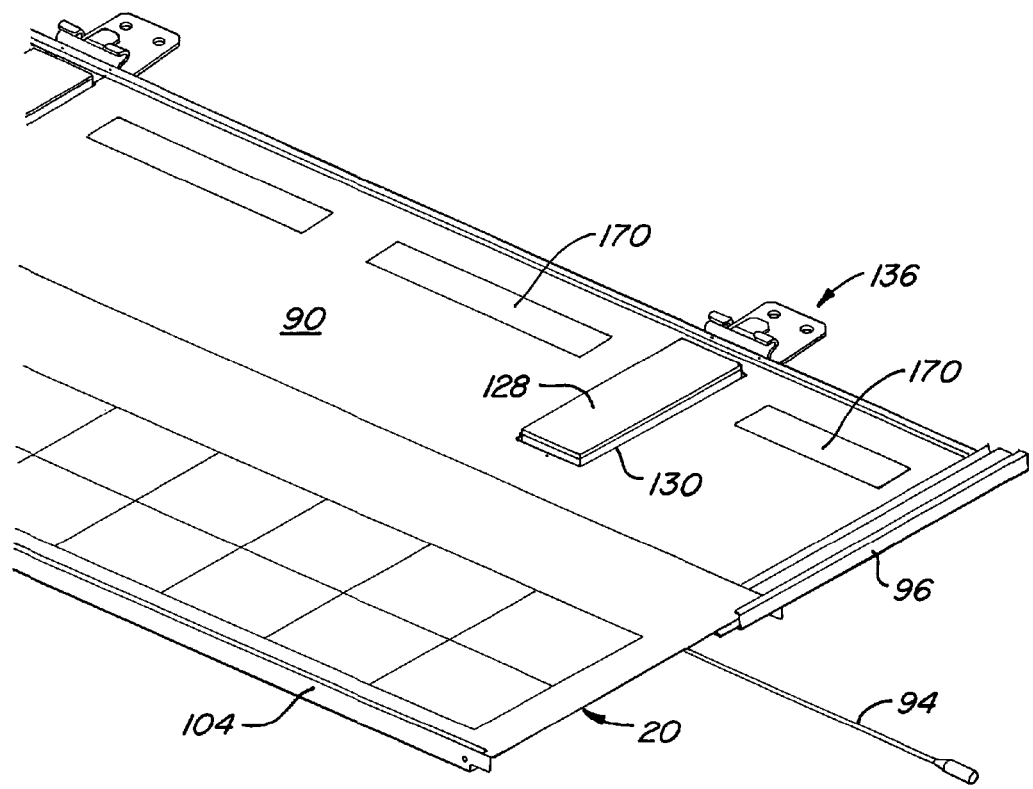
Figure 25:
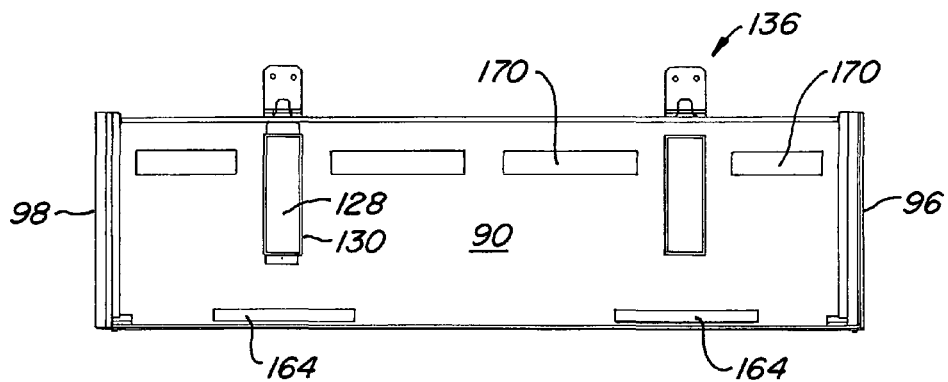
Figure 26:
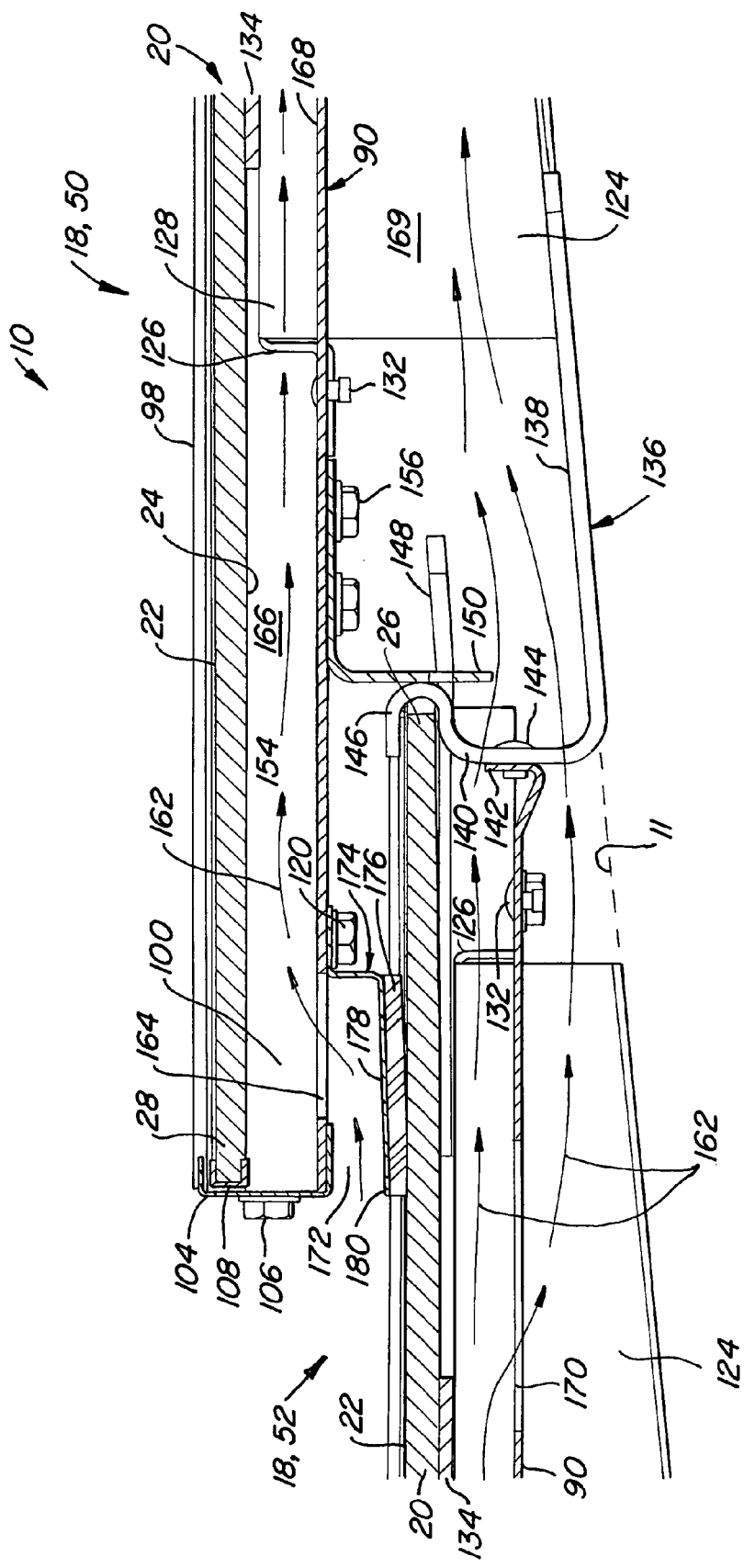
Figure 28:
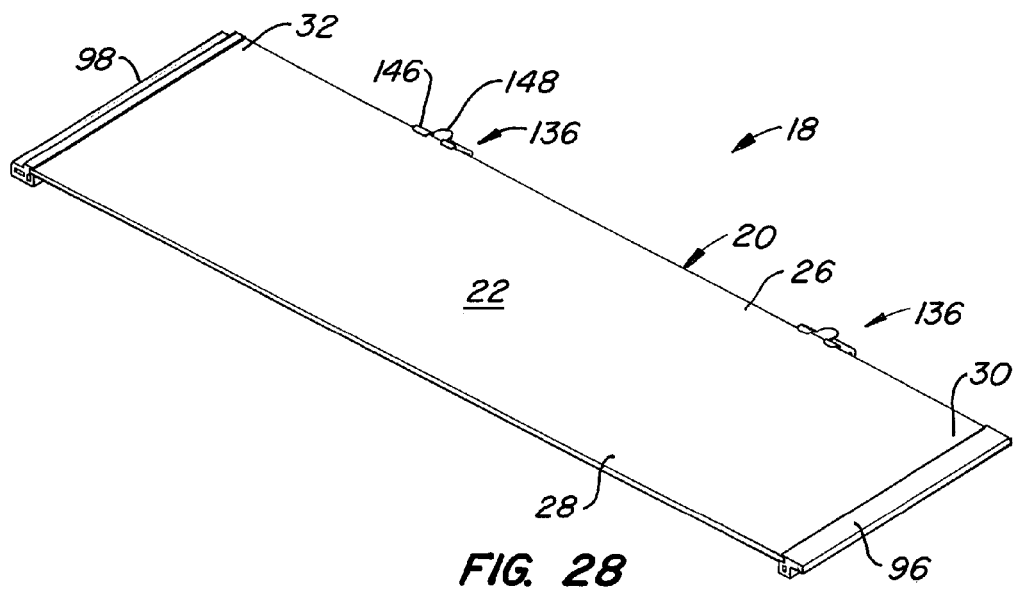
FIG. 28 is a top isometric view of an alternative embodiment of a PV shingle assembly that does not use a fire shield as in the embodiment of FIGS. 15-27.
Figure 29:
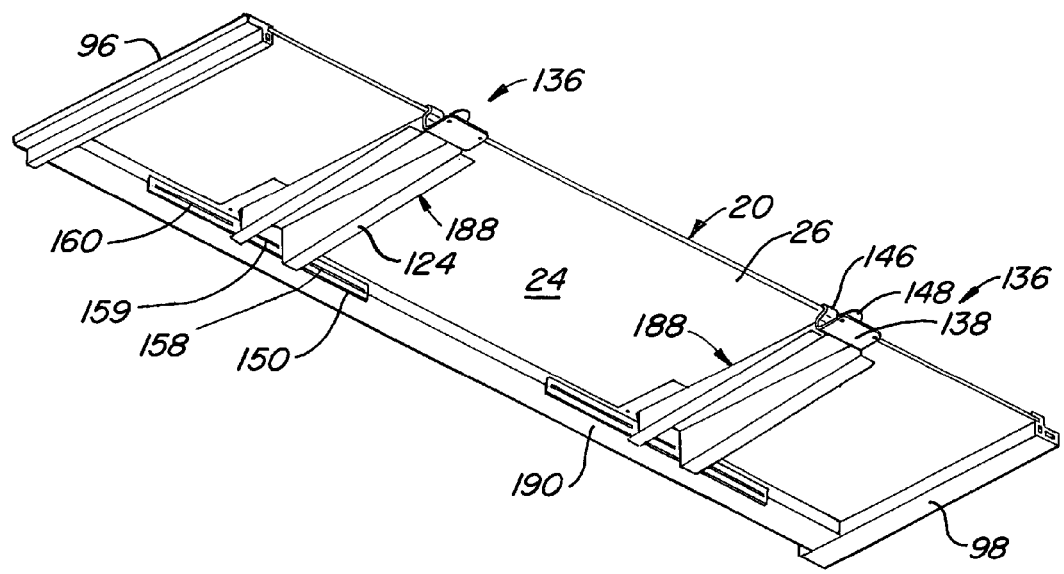
FIG. 29 is a bottom isometric view of the assembly of FIG. 28.

Support and inter-engagement assembly 97 includes vertical support structure 122 for vertically supporting PV assembly 95 on support surface 11. Structure 122 includes a pair of tapered central supports 124. Central supports 124 extend along a line extending between upper PV edge 26 and lower PV edge 28. The length of central supports 124 along such line is preferably at least 50% of the distance between upper and lower edges 26, 28. Central supports 124 have a generally U-shaped cross-sectional shape and have mounting tabs 126 at each end. The upper ends 128 of central supports 124 pass through openings 130 formed in fire shield 90 as shown in FIGS. 24 and 25. Mounting tabs 126 are secured to fire shield 90 by rivets 132 as shown in FIG. 26. A pair of resilient, typically rubber, pads 134 are positioned between upper ends 128 of each central support 124 and lower PV surface 24. Central supports 124 not only support fire shield 90 and the various structures mounted to the fire shield, central supports 124 in conjunction with pads 134 also help to prevent excessive deflection of PV body 20 when, for example, it may be walked on.

Vertical support structure 122 also includes a pair of upper mounting brackets 136 each having a base 138 that lies against and is securable to support surface 11 by conventional or unconventional structure, including nails, screws and adhesive. Mounting bracket 136 also has an upright portion 140 to which an upturned edge 142 of fire shield 90 is secured by rivets 144. Upright portion 140 also includes a generally U-shaped clip 146 within which upper PV edge 26 is housed. Clip 146 limits how far PV body 20 is inserted between edge elements 96, 98. Thus, PV assembly 95 is primarily supported by central supports 124 and mounting brackets 136, both of which engage fire shield 90.

Support and inter-engagement assembly 97 also includes upper and lower interlock elements. Upper mounting bracket 136 includes a tab 148 extending from upright portion 140. Tab 148 acts as the upper interlock element. Lower interlock element 150 includes an elongate L-shaped body 152 secured adjacent to the lower surface 154 of fire shield 90 using screws 156 passing through the ends of body 152, through fire shield 90 and into edge elements 96, 98. Body 152 has a number of slots 158, 159, 160 sized for receipts of tabs 148. The total width of slots 158, 159, 160 is oversized by a chosen distance relative to the width of tabs 148. This permits shingle assemblies 18 to be laterally staggered over a range of positions relative to adjacent shingle assemblies. This flexibility is important to, for example, allow shingle assemblies 18 to follow the contour of a hip roof. In this disclosed embodiment the chosen distance is at least about 20% of the length of lower PV edge 28.

As shown in FIGS. 20 and 26, a ventilation path 162 extends from front piece 104 at lower PV edge 28, through a vent entrance opening 164 in fire shield 90, and through an open region 166 defined between the upper surface 168 of fire shield 90 and lower surface 24 of PV body 20. Ventilation path 162 exits open region 166 through a vent exit opening 170 in fire shield 90 and also between upturned edge 142 of fire shield 90. Ventilation path 162 then extends past upper PV edge 26 and enters a region 169 below lower surface 154 of fire shield 90 of the adjacent, upstream PV shingle assembly 18. The flow of air along ventilation path 162 helps to cool PV body 20 thus increasing energy conversion efficiency. The inclination of support surface 11 helps to pull air along ventilation path 162 by virtue of the chimney effect. It is important to recognize that all, or at least substantially all, of the air passing through open region 166 has not passed through the open region of another PV shingle assembly 18 of a roofing system 10. After air has passed through a vent exit opening 170 of one assembly 18, the air passes beneath the fire shield 90 of the upstream assemblies so that only fresh, relatively cool air enters vent entrance openings 164 of assemblies 18.

It is important that PV shingle assemblies act as water-shedding shingles, in the same manner as concrete tiles 16, for support surface 11. The rain-shedding feature is provided by upper shingle assembly 50 overlapping lower shingle assembly 52, typically by about 7.5 cm (3 inches). The rain-shedding feature is also provided between laterally adjacent assemblies 18 by the placement of an extension 171 of second inter-engageable edge element 98 beneath first, inter-engageable edge element 96. As shown in FIGS. 21 and 22, edge elements 96, 98 also include interior drain conduits 173 to collect any water that may seep between side edges 30, 32 and grooves 112, 114.

As can be seen in FIG. 26, there is a gap 172 between front piece 104 of first, upper shingle assembly 50 and shingle body 20 of second, lower shingle assembly 52. Gap 172 acts as the initial portion of ventilation path 162. However, it is at least desirable to prevent rain from being blown, or otherwise passing, through gap 172, past upper PV edge 26 of shingle assembly 52 and onto support surface 11. To prevent this, a rain guard 174 is mounted along the entire width of the PV shingle assembly adjacent to lower surface 154 of fire shield 90. Rain guard 174 is secured in this position by screws 120 passing through holes at either end of the rain guard, through fire shield 90 and into edge elements 96, 98. In FIG. 26 a resilient pad 176 is positioned between the lower leg 178 of rain guard 174 and upper surface 22 of PV body 20. However, it may be preferred in many or most cases to omit pad 176 and configure rain guard 174 so that the distal end 180 of lower leg 178 effectively contacts surface 22; that is rain guard 174 contacts surface 22 or is close enough to surface 22 to still act as an effective rain guard. This should provide sufficient sealing to prevent rain from being blown between rain guard 174 and surface 22 while permitting any small amounts of rain that may collect on surface 22 between rain guard 174 and upper PV edge 26 to seep down surface 22 between rain guard 174 and surface 22.

One of the advantages of the present design is that by simply removing screws 106, front piece 104 may be disconnected from edge elements 96, 98 and then PV body 20 can be removed from between edge elements 96, 98 by simply sliding it out as suggested in FIG. 24. If needed, electrical connections may be accessed through vent exit openings 170 in fire shield 90 so that a PV shingle assembly 18 can be disconnected from adjacent assemblies 18 and PV body 20 completely removed. This permits the removal of PV body 20 from an array of PV shingle assemblies 18 for one or more of inspection, testing, cleaning, repair or replacement.

Another advantage of the present design accrues through the use of fire shield 90. The design of PV shingle assemblies 18 including fire shield 90 provides several fire safety improvements over conventional PV shingle assemblies.

Conventional PV bodies 20 typically include a fireproof, glass upper surface 22 covering combustible polymer-containing substrates extending to lower surface 24. In the event of a fire, PV bodies 20 typically generate combustible gases at lower surface 24. Without the use of fire shield 90, oxygen is available to combust those combustible gases thus permitting PV bodies 20 to burn rapidly. With the use of fire shield 90, the rate of combustion is slowed down by preventing the free access of oxygen to open region 166 and lower surface 24. These combustible gases are then diverted away from open region 166 as they pass through vent openings 164, 170. Edge elements 96, 98 act as airflow barriers to prevent the flow of air or other gases past the edge elements and into and out of open region 166. The diverted gases that pass through vent entrance openings 164 generally combust above or to the side shingle assemblies 18. The combustible gases that pass through vent exit openings 170 combust at a slower rate because of the relative unavailability of oxygen in region 169 between fire shield 90 and support surface 11. Therefore, fire shield 90 helps to promote fire safety by slowing the combustion rate of PV body 20.

A conventional test used to determine the fire rating of roofing systems uses a burning block of wood measuring 30.5 cm×30.5 cm×5.7 cm (12"×12"×2.25") and weighing 2500 g+/−50 g, the block of wood burning at a temperature of 537° C.-815° C. (1000° F.-1500° F.). The burning block of wood is placed onto the roofing structure to see if the roofing surface maintains its structural integrity. Fire shield 90 is preferably designed to pass this test. In one preferred embodiment fire shield 90 is a sheet of steel at least 0.61 mm (0.024") thick.

To help maintain the effectiveness of fire shield 90, it is preferred that the ratio of the area of upper fire shield surface on 68 to the area of lower PV surface 24 be at least 0.7 to 1.0. In addition, it is preferred that fire shield 90 act as a radiant barrier to minimize radiation of heat energy from the fire shield to support surface 11. Making fire shield 90 of sheet metal can inherently provide this desirable radiant barrier feature.

FIG. 27 is an enlarged cross-sectional view similar to that of FIG. 22 of alternative embodiment in which there is a small gap, or no gap, between fire shield 90A and lower PV surface 24. With this embodiment fire shield 90A has no vent entrance openings 164 so that ventilation path 162 passes below lower fire shield surface 154. Although this embodiment does not provide the level of cooling of PV body 20 as does the prior embodiment of FIGS. 15-26, it eliminates the potential need for using expensive heat sensitive intumescent paint on upper surface 68 of fire shield 90. That is, it may be desirable or necessary to use something that blocks or fills open region 166, such as heat sensitive intumescent paint on upper surface 68 of fire shield 90, with the large-gap embodiment of FIGS. 15-26. Therefore, it would be a trade-off between a lower operational temperature, with higher electrical generation efficiency, for the large-gap embodiment of FIGS. 15-26 versus the higher operational temperature, with lower electrical generation efficiency, for the small gap embodiment of FIG. 27.

The various components may be made of conventional or unconventional materials suitable for use in an outdoor environment. For example, extruded aluminum having an anodized or painted finish may be used for edge elements 96, 98, galvanized, Glavalume, or aluminized steel may be used for central supports 124, mounting brackets 136, and lower interlock element 150, while sheet aluminum having an anodized or painted finish may be used for rain guard 174.

FIGS. 28-32 disclose an alternative embodiment of a PV shingle assembly 18 with like reference numeral referring to like elements. This embodiment does not use a fire shield as in the embodiment of FIGS. 15-27 and thus may be a lower-cost alternative. This embodiment may find the greatest utility when PV body 20 is substantially non-flammable. One example of a substantially non-flammable PV body 20 would be a laminate having layers of glass on either side.

Figure 30:
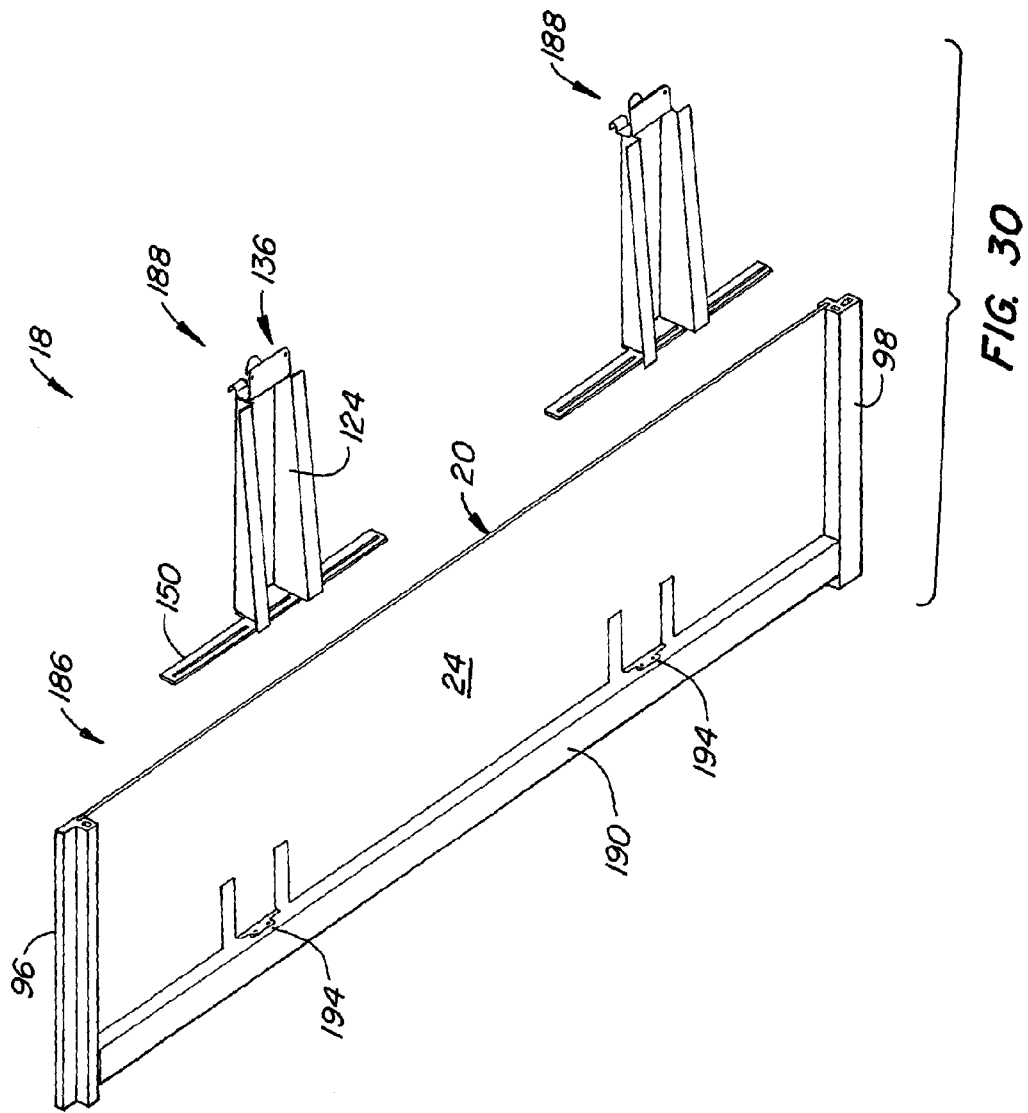
FIG. 30 is a partially exploded bottom isometric view of the assembly of FIG. 29 illustrating the PV module assembly and a pair of brackets of assemblies.
Figure 31:
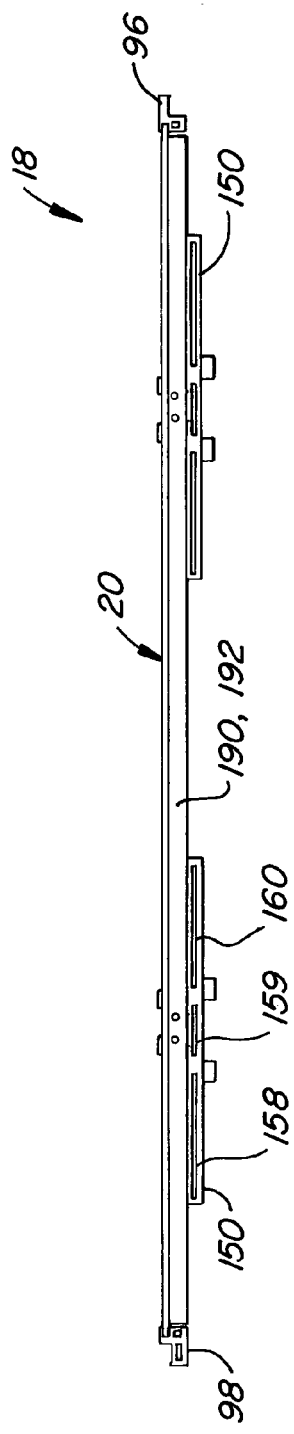
FIG. 31 is a front elevational view of the assembly of FIG. 28.
Figure 32:
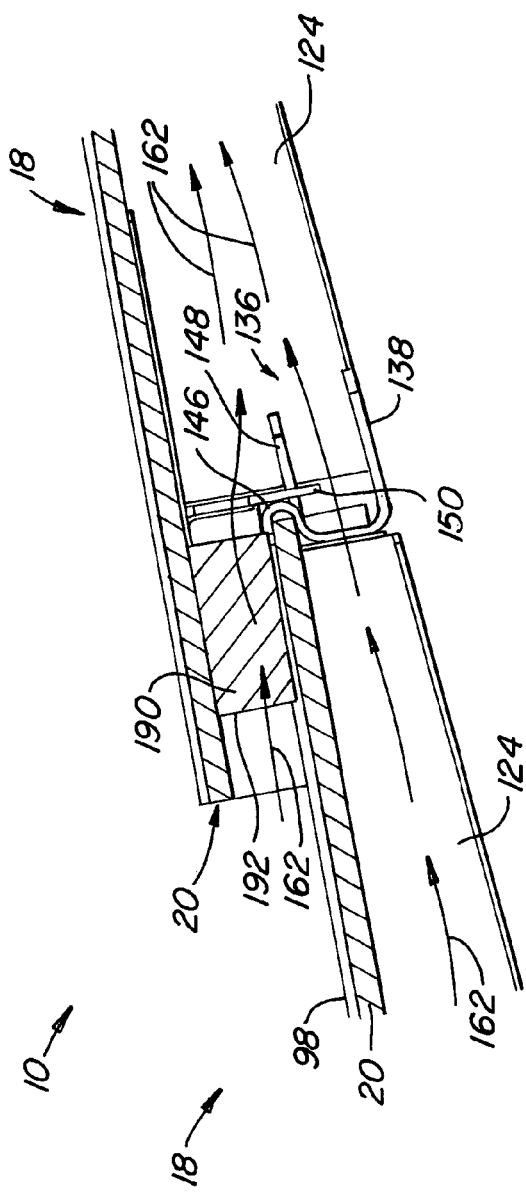
FIG. 32 is a cross-sectional view showing the inter-engagement of two shingle assemblies of FIG. 28.

The PV shingle assembly 18 of FIGS. 28-32 comprises a PV module assembly 186 and a pair of bracket assemblies 188. PV module assembly comprises a rain guard 190 made of a block of honeycomb material. The honeycomb material may be thought of as plastic straws bonded together so that their axes are aligned. The cross-sectional diameter of the passageways passing through the honeycomb material is preferably the range of 3-6 mm. The passageways may have circular, hexagonal, or other regular or irregular cross-sectional shapes of the same or different diameters. The axes of the passageways are generally parallel to edge elements 96, 98. Testing has shown that, due to surface tension, little or no rain passes through the passageways. This prevents water from moving past rain guard 190. However, under non-rain conditions the entire front face 192, see FIG. 31, is substantially open to airflow through rain guard 190 so to cool the body 20.

In this disclosed embodiment rain guard 190 is secured to lower surface 24, typically with an adhesive. Rain guard 190 could be secured to upper surface 22 of PV body 20 along upper edge 26. Also, rain guard 190 could be a separate component secured between the overlapping portions of adjacent PV assemblies 18 after the PV assemblies have been mounted to support surface 11.

PV module assembly 186 also includes a mounting bracket 194 adhered to lower surface 24 of PV body 20 for each bracket assembly 188; see FIG. 30. Mounting bracket 194 is used to secure lower interlock element 150 of bracket assembly 188 to lower surface 24 of PV body 20, typically using screws, not shown. Once installed on a support surface 11, a PV module assembly 186 can be disconnected from mounting brackets 194 and removed leaving mounting brackets 136 secured to support surface 11.

The accessible parts of PV shingle assembly 18 of FIGS. 28-32, in particular edge elements 96, 98 and rain guard 190, are preferably made of non-conductive materials. Doing so can eliminate the need for grounding, which can be a major advantage. Edge elements 96, 98 and rain guard 190 also preferably have low flammability. In addition, edge elements 96, 98 preferably have good weatherability. Preferred materials for edge elements 96, 98 include materials such as some silicone rubbers, such as Dow-Corning Silastic® 21180, fire retardant EPDMs, such as available from TSE Industries, and ceramics. We have found that some polycarbonates, such as GE Lexan® 950, 950A, 953, are good materials for the rain guard.

Other modifications and variations can be made to the disclosed embodiments without departing from the subject of the invention as defined in the following claims. For example, instead of having PV shingle assemblies 18 interlock with one another, which eliminates the need to secure the lower edge of each assembly 18 to the support surface, each assembly 18 may be fastened to the support surface 11 using appropriate support structure with, for example, nails or screws, along their lower edges as well as their upper edges. That is, each PV shingle assembly 18 would be independently secured to the support surface, typically along their upper and lower edges or along their side edges. Also, front piece 104 could be indirectly connected or coupled to edge elements 96, 98, such as by being releasably secured to fire shield 90. Also, front piece 104 could include structure that does not extend along the entire length of lower PV edge 28, such as one or more clips engaging one, some or all of edge elements 96, 98 and fire shield 90. Further, front piece 104 could remain secured to PV body 20 after being released from, for example, edge elements 96, 98.

Any and all patents, patent applications and printed publications referred to above are incorporated by reference.

What is claimed is:

1. A photovoltaic assembly configured for mounting to a roof, the assembly comprising:
   at least a first photovoltaic module supported above the roof at an inclined angle, the first photovoltaic module having an upper surface, a lower surface, an upper edge, a lower edge and side PV edges; and
   a fire shield member having a central portion disposed below and spaced from the lower surface of the first photovoltaic module, the fire shield member having an upper edge, a lower edge, and side edges engaging the upper edge, lower edge, and side PV edges of the first photovoltaic module so as to form a substantially enclosed volume of space between an upper surface of the fire shield member and the lower surface of the first photovoltaic module;
   wherein the fire shield member further comprises at least a first longitudinal protrusion, protruding upwardly from the upper surface of the fire shield member toward the lower surface of the first photovoltaic module, the first protrusion extending a substantial portion of the distance longitudinally between the lower edge of the fire shield member and the upper edge of the fire shield member,
   wherein the fire shield member is offset from the roof to define a volume of space between a lower surface of the fire shield member and the roof.

2. The photovoltaic assembly according to claim 1, wherein the fire shield member comprises at least a first lower ventilation hole disposed toward the lower edge of the fire shield member and at least a first upper ventilation hole disposed toward the upper edge of the fire shield member, so as to allow a flow of air to flow into the substantially enclosed volume of space through the first lower ventilation hole and out of the substantially enclosed volume of space through the first upper ventilation hole.

3. A photovoltaic assembly configured for mounting to a support surface, the assembly comprising:
   at least a first photovoltaic module supported above a support surface at an inclined angle, the first photovoltaic module having an upper surface, a lower surface, an upper edge, a lower edge and side PV edges; and
   a fire shield member having a central portion disposed below and spaced from the lower surface of the first photovoltaic module, the fire shield member having an upper edge, a lower edge, and side edges engaging the upper edge, lower edge, and side PV edges of the first photovoltaic module so as to form a substantially enclosed volume of space between an upper surface of the fire shield member and the lower surface of the first photovoltaic module;

wherein the fire shield member comprises at least a first lower ventilation hole disposed toward the lower edge of the fire shield member and at least a first upper ventilation hole disposed toward the upper edge of the fire shield member, so as to allow a flow of air to flow into the substantially enclosed volume of space through the first lower ventilation hole and out of the substantially enclosed volume of space through the first upper ventilation hole;

wherein the fire shield member further comprises at least a second lower ventilation hole disposed toward the lower edge of the fire shield member and a protrusion extending upwardly from the upper surface of the fire shield member and longitudinally between the lower edge of the fire shield member and the upper edge of the fire shield member, the protrusion being disposed between the first and second lower ventilation holes.

4. The photovoltaic assembly according to claim 1, wherein the fire shield member further comprises at least a second longitudinal protrusion extending generally parallel to the first longitudinal protrusion.

5. A photovoltaic assembly configured for mounting to a support surface, the assembly comprising:

at least a first photovoltaic module supported above a support surface at an inclined angle, the first photovoltaic module having an upper surface, a lower surface, an upper edge, a lower edge and side PV edges; and a fire shield member having a central portion disposed below and spaced from the lower surface of the first photovoltaic module, the fire shield member having an upper edge, a lower edge, and side edges engaging the upper edge, lower edge, and side PV edges of the first photovoltaic module so as to form a substantially enclosed volume of space between an upper surface of the fire shield member and the lower surface of the first photovoltaic module;

wherein the fire shield member further comprises at least a first longitudinal protrusion, protruding upwardly from the upper surface of the fire shield member toward the lower surface of the first photovoltaic module, the first protrusion extending a substantial portion of the distance longitudinally between the lower edge of the fire shield member and the upper edge of the fire shield member, wherein the first longitudinal protrusion comprises a support member disposed below the fire shield member and extending through an aperture formed in the fire shield member.

6. A photovoltaic assembly configured for mounting to a roof, the assembly comprising:

at least a first photovoltaic module supported above the roof at an inclined angle, the first photovoltaic module having an upper surface, a lower surface, an upper edge, a lower edge and side PV edges; and a fire shield member having a central portion disposed below and spaced from the lower surface of the first photovoltaic module, the fire shield member having an upper edge, a lower edge, and side edges engaging the upper edge, lower edge, and side PV edges of the first photovoltaic module so as to form a substantially enclosed volume of space between an upper surface of the fire shield member and the lower surface of the first photovoltaic module;

wherein the fire shield member further comprises at least a first longitudinal protrusion, protruding upwardly from the upper surface of the fire shield member toward the lower surface of the first photovoltaic module, the first protrusion extending longitudinally between the lower edge of the fire shield member and the upper edge of the fire shield member, wherein the fire shield member further comprises at least a second longitudinal protrusion extending generally parallel to the first longitudinal protrusion, wherein a first lower ventilation hole is disposed between the first and second longitudinal protrusions, wherein the fire shield member is offset from the roof to define a volume of space between a lower surface of the fire shield member and the roof.

7. A photovoltaic assembly configured for mounting to a support surface, the assembly comprising:

at least a first photovoltaic module supported above a support surface at an inclined angle, the first photovoltaic module having an upper surface, a lower surface, an upper edge, a lower edge and side PV edges; and a fire shield member having a central portion disposed below and spaced from the lower surface of the first photovoltaic module, the fire shield member having an upper edge, a lower edge, and side edges engaging the upper edge, lower edge, and side PV edges of the first photovoltaic module so as to form a substantially enclosed volume of space between an upper surface of the fire shield member and the lower surface of the first photovoltaic module;

wherein the fire shield member further comprises at least a first longitudinal protrusion, protruding upwardly from the upper surface of the fire shield member toward the lower surface of the first photovoltaic module, the first protrusion extending a substantial portion of the distance longitudinally between the lower edge of the fire shield member and the upper edge of the fire shield member, wherein the first longitudinal protrusion is spaced from the lower edge of the fire shield member and spaced from the upper edge of the fire shield member.

8. The photovoltaic assembly according to claim 1, wherein the first longitudinal protrusion extends generally parallel to the side edges of the fire shield member.

9. The photovoltaic assembly according to claim 1, wherein the side edges of the fire shield member wrap around the side PV edges of the first photovoltaic module, respectively.

10. A photovoltaic array mounted to an inclined roof, comprising:

at least a first photovoltaic module, supported above the roof having a lower surface, an upper edge, a lower edge, and side edges; at least a first fire shield member connected to and disposed below the first photovoltaic module, the first fire shield member having an upper edge, lower edge, and side edges connected to the upper edge, lower edge, and side edges of the first photovoltaic module, the first fire shield member having a central portion with an upper surface disposed below the lower surface of the first photovoltaic module thereby defining a first substantially enclosed volume of space between the first photovoltaic module and the first fire shield member~ wherein the first fire shield member further comprises at least a first longitudinal protrusion, protruding upwardly from the upper surface of the first fire shield member toward the lower surface of the first photovoltaic module, the first protrusion extending a substantial portion of the distance longitudinally between the lower edge of the first fire shield member and the upper edge of the first fire shield member; at least a second photovoltaic module having a lower service, upper edge, lower edge, and side edges; the second photovoltaic module being disposed adjacent to the first photovoltaic module such that a side edge of the second photovoltaic module is juxtaposed to a side edge of the first photovoltaic module;

at least a second fire shield member connected to and disposed below the second photovoltaic module, the second fire shield member having an upper edge, lower edge, and side edges connected to the upper edge, lower edge, and side edges of the second photovoltaic modules, the second fire shield member having a central portion of an upper surface disposed below the lower surface of the second photovoltaic module, thereby defining a second substantially enclosed volume of space between the second photovoltaic module and the second fire shield member;

wherein each of the first and second fire shield members comprise at least a first lower ventilation hole formed in the central portion and disposed toward the lower edge of each of the first and second fire shield members and at least a first upper ventilation hole formed in the central portion disposed toward the upper edge of each of the first and second fire shield members, wherein the first and second substantially enclosed volumes of space are separate from each other, wherein at least the first fire shield member is offset from the inclined roof to define a volume of space between a lower surface of the first fire shield member and the inclined roof.

11. The photovoltaic array according to claim 10, wherein each of the first and second fire shield members include at least a first protruding portion extending longitudinally between the lower edges and the upper edges of the respective first and second fire shield members.

12. The photovoltaic array according to claim 11, wherein each of the first and second fire shield members include at least a second lower ventilation hole, each of the first protruding portions being disposed between the respective first and second lower ventilation holes.

13. The photovoltaic array according to claim 10 wherein the first protruding portion comprises an aperture formed the central portion of each of the first and second fire shield members and a support member disposed below the fire shield member and extending upwardly through the aperture.

14. The photovoltaic array according to claim 10, wherein the first lower ventilation hole and the first upper ventilation hole are configured to allow a restricted flow of air to flow into the substantially enclosed volume of space through the lower ventilation hole and out of the substantially enclosed volume of space through the upper ventilation hole.

15. The photovoltaic array according to claim 10, wherein each of the first and second fire shield members comprise at least first and second protruding portions, with at least one lower ventilation hole disposed directly between the first and second protruding portions.

16. The photovoltaic array according to claim 15, wherein each of the first and second fire shield members comprise at least three lower ventilation holes, at least one ventilation hole being disposed between the first and second protruding portions, the other to lower ventilation holes being disposed on the opposite sides of both of the first and second protruding portions.

17. The photovoltaic array according to claim 10, wherein each of the first and second fire shield members include at least a second upper ventilation hole.

18. The photovoltaic array according to claim 10, wherein each of the first and second substantially enclosed volumes of space comprise a plenum.

19. The photovoltaic array of courting to claim 11, wherein the first protruding portion provides additional resistance against deflection of the central portion of the fire shield member.

20. A photovoltaic assembly configured for mounting to a roof, the assembly comprising:

at least a first photovoltaic module supported above the roof at an inclined angle, the first photovoltaic module having an upper surface, a lower surface, an upper edge, a lower edge and side PV edges; and a fire shield member having a central portion disposed below and spaced from the lower surface of the first photovoltaic module, the fire shield member having an upper edge, a lower edge, and side edges engaging the upper edge, lower edge, and side PV edges of the first photovoltaic module so as to form a substantially enclosed volume of space between an upper surface of the fire shield member and the lower surface of the first photovoltaic module;

wherein the fire shield member further comprises at least a first longitudinal protrusion, protruding upwardly from the upper surface of the fire shield member toward the lower surface of the first photovoltaic module, the first protrusion extending along at least fifty-percent of the distance longitudinally between the lower edge of the fire shield member and the upper edge of the fire shield member, wherein the fire shield member is offset from the roof to define a volume of space between a lower surface of the fire shield member and the roof.

21. The photovoltaic assembly of claim 1, wherein at least a portion of the first protrusion extends between the fire shield member and the roof so as to maintain the offset between the fire shield member and the roof.

22. The photovoltaic assembly of claim 21, wherein the volume of space between the lower surface of the fire shield member and the roof is sized to permit airflow between the fire shield member and the roof.

23. The photovoltaic assembly of claim 20, wherein at least a portion of the first protrusion extends between the fire shield member and the roof so as to maintain the offset between the fire shield member and the roof.

24. The photovoltaic assembly of claim 23, wherein the volume of space between the lower surface of the fire shield member and the roof is sized to permit airflow between the fire shield member and the roof.

* * * * *